(12) United States Patent
Xu et al.

(10) Patent No.: US 9,620,612 B2
(45) Date of Patent: Apr. 11, 2017

(54) INTERGRATED CIRCUIT DEVICES INCLUDING AN INTERFACIAL DIPOLE LAYER

(71) Applicant: QUALCOMM Incorporated, San Diego, CA (US)

(72) Inventors: Jeffrey Junhao Xu, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/625,974

(22) Filed: Feb. 19, 2015

(65) Prior Publication Data

US 2016/0247893 A1    Aug. 25, 2016

(51) Int. Cl.
| | |
|---|---|
| *H01L 29/51* | (2006.01) |
| *H01L 29/66* | (2006.01) |
| *H01L 29/78* | (2006.01) |
| *H01L 27/08* | (2006.01) |
| *H01L 27/088* | (2006.01) |
| *H01L 21/28* | (2006.01) |
| *H01L 27/11592* | (2017.01) |
| *G11C 11/22* | (2006.01) |

(52) U.S. Cl.
CPC ......... *H01L 29/517* (2013.01); *G11C 11/221* (2013.01); *H01L 21/28291* (2013.01); *H01L 27/088* (2013.01); *H01L 27/11592* (2013.01); *H01L 29/6684* (2013.01); *H01L 29/66545* (2013.01); *H01L 29/66568* (2013.01); *H01L 29/66795* (2013.01); *H01L 29/78* (2013.01); *H01L 29/785* (2013.01)

(58) Field of Classification Search
CPC ............. H01L 29/517; H01L 29/66568; H01L 29/66795; H01L 29/78; H01L 29/785; H01L 27/088
See application file for complete search history.

(56) References Cited

U.S. PATENT DOCUMENTS

| | | |
|---|---|---|
| 6,258,651 B1 | 7/2001 | Jenq et al. |
| 7,095,083 B2 * | 8/2006 | Cho ................. H01L 21/76895 257/368 |

(Continued)

OTHER PUBLICATIONS

Boscke T.S., et al., "Ferroelectricity in Hafnium Oxide: CMOS compatible Ferroelectric Field Effect Transistors," IEEE International Electron Devices Meeting (IEDM), 2011, pp. 24.5.1-24.5.4.

(Continued)

*Primary Examiner* — Ida M Soward
(74) *Attorney, Agent, or Firm* — Toler Law Group, PC

(57) ABSTRACT

An integrated circuit device includes a first transistor structure formed in a memory region (e.g., an embedded memory region) of a die. The first transistor structure includes a substrate (e.g., a planar substrate of a planar FET or a fin of a FinFET) and a first gate. The first gate includes a dipole layer proximate to the substrate and a barrier layer proximate to the dipole layer. The integrated circuit device further includes a second transistor structure formed in a logic device region of the die. The second transistor structure includes a second gate that includes an interface layer, a dielectric layer, and a cap layer. The dielectric layer is formed between the cap layer and the interface layer.

12 Claims, 13 Drawing Sheets

(56) References Cited

U.S. PATENT DOCUMENTS

| | | | |
|---|---|---|---|
| 7,563,678 B2* | 7/2009 | Koyama | H01L 21/82384 257/E21.637 |
| 8,597,995 B2 | 12/2013 | Xu | |
| 8,748,250 B2 | 6/2014 | Xu et al. | |
| 8,946,800 B2* | 2/2015 | Kume | H01L 27/10808 257/296 |
| 2005/0136649 A1* | 6/2005 | Lee | H01L 21/76897 438/637 |
| 2008/0308870 A1* | 12/2008 | Faul | H01L 27/10838 257/368 |
| 2009/0108373 A1* | 4/2009 | Frank | H01L 27/11 257/392 |
| 2009/0261395 A1 | 10/2009 | Boescke | |
| 2010/0330764 A1* | 12/2010 | Akiyama | H01L 21/2686 438/308 |
| 2012/0326245 A1 | 12/2012 | Ando et al. | |
| 2013/0105905 A1 | 5/2013 | Ji et al. | |
| 2013/0270619 A1 | 10/2013 | Schloesser et al. | |
| 2014/0004711 A1* | 1/2014 | Akiyama | H01L 21/02178 438/761 |
| 2014/0153312 A1 | 6/2014 | Sandhu et al. | |
| 2014/0154853 A1 | 6/2014 | Xu et al. | |
| 2015/0035073 A1* | 2/2015 | Ando | H01L 21/28229 257/369 |
| 2015/0214226 A1* | 7/2015 | Su | H01L 27/0886 257/401 |
| 2015/0249015 A1* | 9/2015 | Ando | H01L 21/28229 438/591 |
| 2015/0349073 A1* | 12/2015 | Kang | H01L 29/4236 257/330 |
| 2016/0071947 A1* | 3/2016 | Wiatr | H01L 21/82346 257/295 |
| 2016/0093672 A1* | 3/2016 | Li | G11C 13/0069 257/4 |
| 2016/0155748 A1* | 6/2016 | Li | H01L 29/7883 257/295 |
| 2016/0336323 A1* | 11/2016 | Ok | H01L 27/0924 |

OTHER PUBLICATIONS

Pantisano L., et al., "Towards Barrier Height Modulation in HfO/TiN by Oxygen Scavenging Dielectric Defects or Metal Induced Gap States?", Microelectronic Engineering, Elsevier Publishers BV., Amsterdam, NL, vol. 88, No. 7, Mar. 23, 2011 (Mar. 23, 2011), pp. 1251-1254, XP028375904, ISSN: 0167-9317, DOI: 10.1016/J.MEE.2011.03.057 [retrieved on Mar. 20, 2011].
Communication Relating to the Results of the Partial International Search—PCT/US2016/015781—ISA/EPO—May 6, 2011, 9 pages.
Muller, J., et al., Ferroelectric Hafnium Oxide: A CMOS-compatible and highly scalable approach to future ferroelectric memories, 2013 IEEE International Electron Devices Meeting, Dec. 2013, IEEE, Piscataway, NJ, 4 pages.
International Search Report and Written Opinio—PCT/US2016/015781—ISA/EPO—Aug. 30, 2016.

* cited by examiner

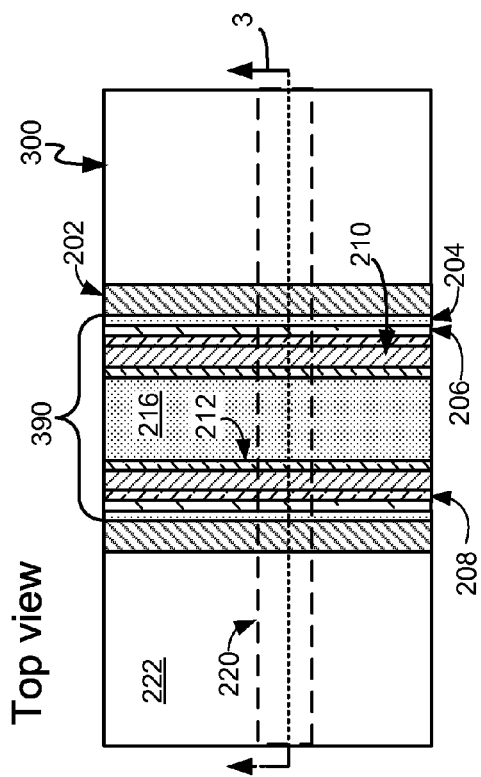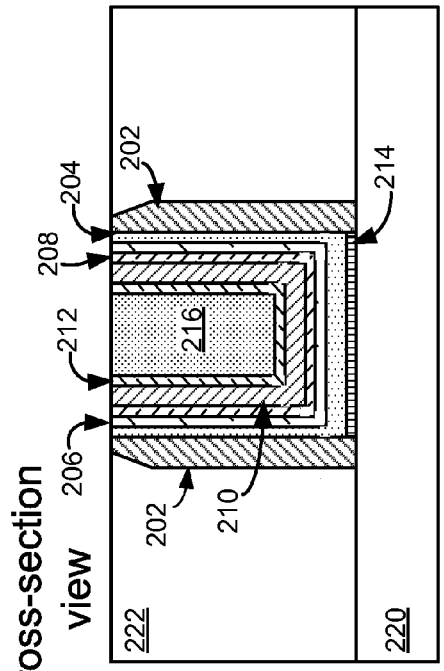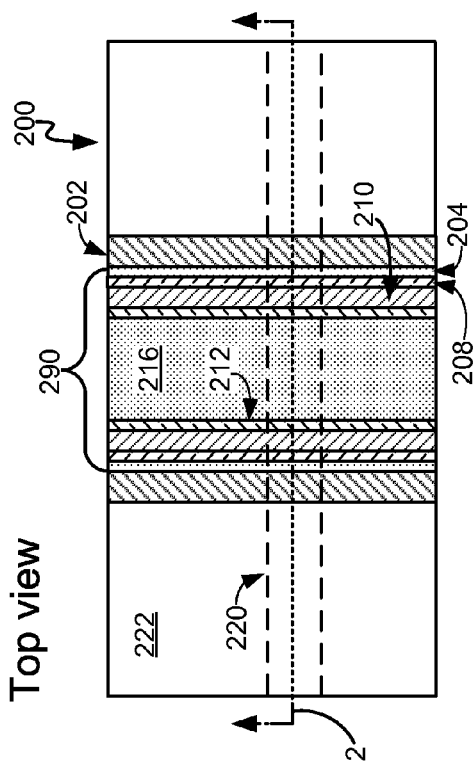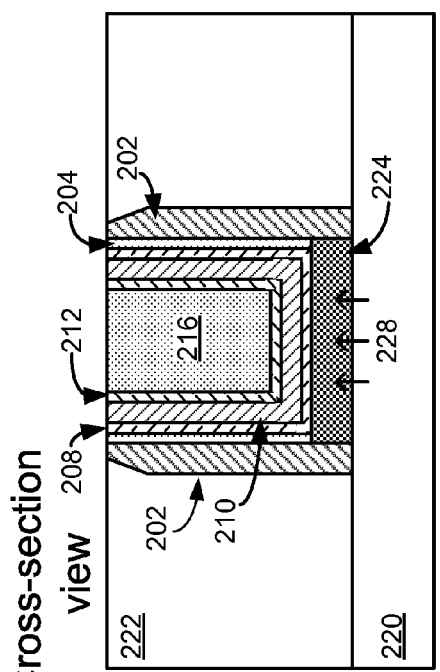

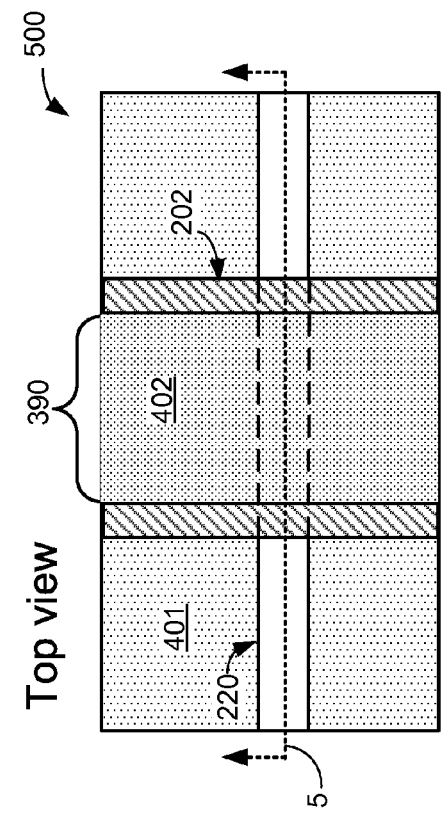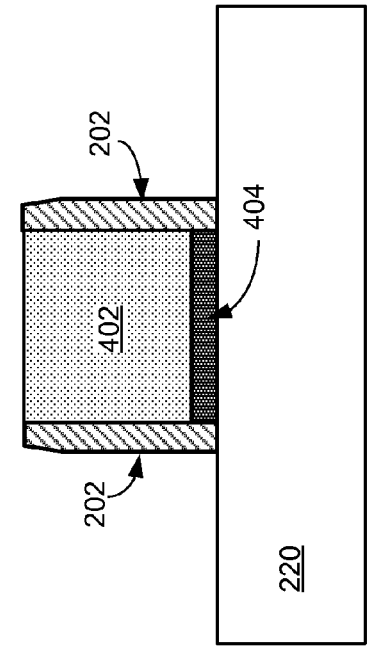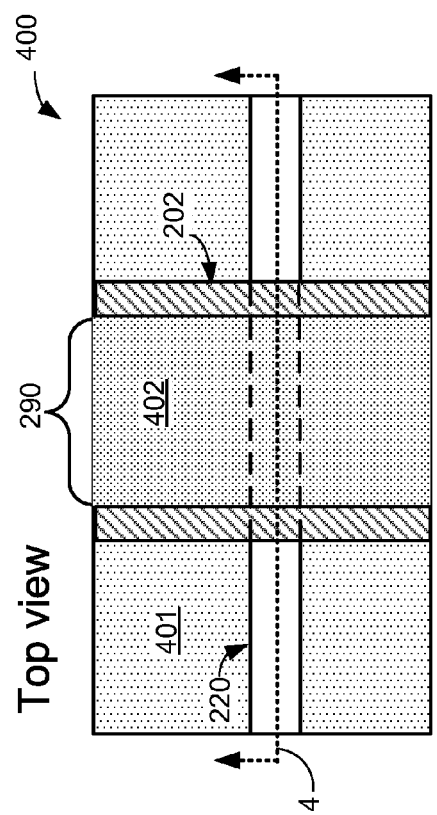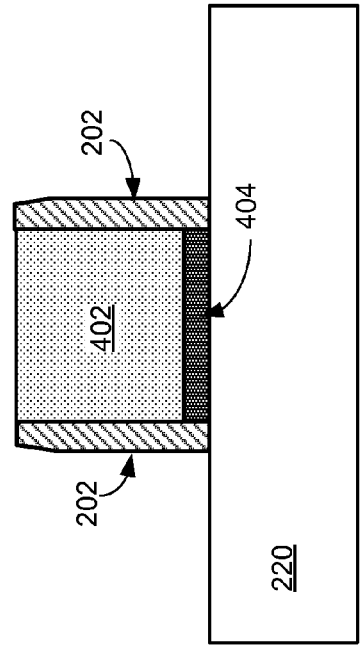
FIG. 4A
FIG. 4B
FIG. 5A
FIG. 5B

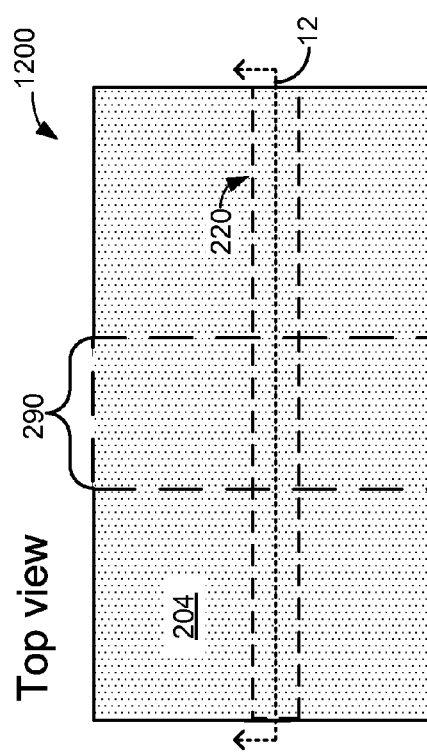
FIG. 12A Top view
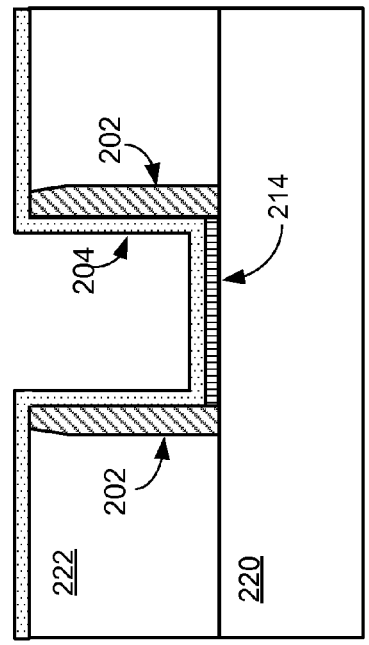
FIG. 12B Cross-section view
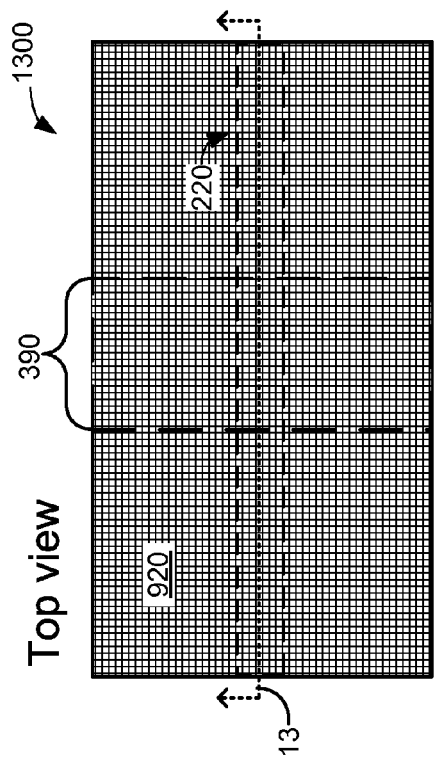
FIG. 13A Top view
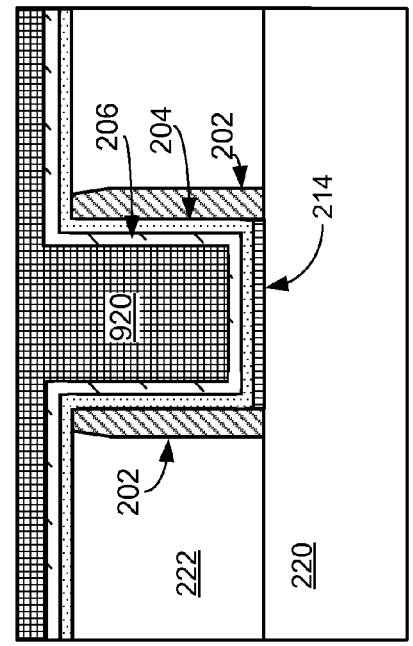
FIG. 13B Cross-section view Top view Cross-section view Top view Cross-section view

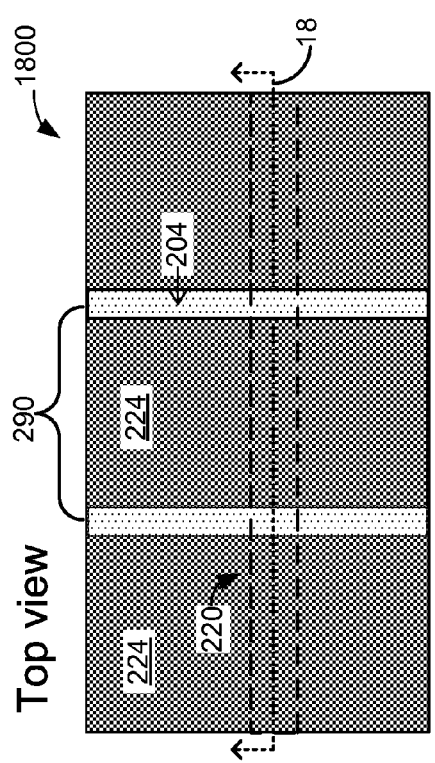
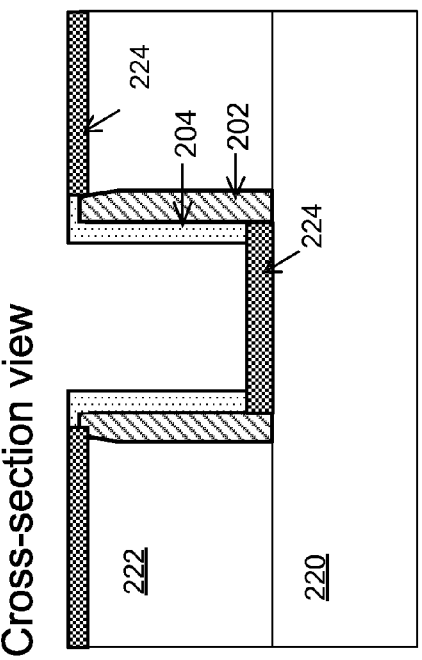
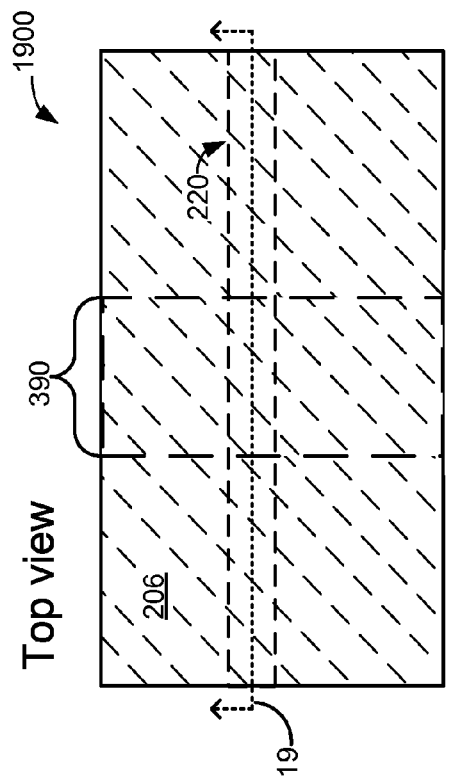
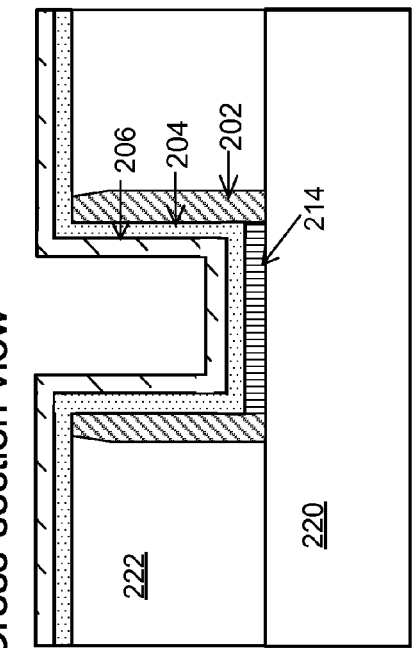

INTERGRATED CIRCUIT DEVICES INCLUDING AN INTERFACIAL DIPOLE LAYER

I. FIELD

The present disclosure is generally related to forming a dipole layer.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Advances in logic devices (e.g., transistors used in logic circuits of wireless computing devices) have led to significant decreases in the sizes of such devices; however, embedded memory devices (e.g., transistors or capacitors used in memory circuits integrated on the same die or module as a logic circuit) have experienced less significant decreases in size. Additionally, techniques to manufacture logic devices have diverged from techniques used to manufacture embedded memory devices. Accordingly, separate process flows are often used to manufacture logic devices and their embedded memory devices, leading to increased manufacturing cost and time.

III. SUMMARY

A single integrated circuit (e.g., a substrate or a die of the integrated circuit) may include both memory components (e.g., an embedded memory) and logic components. At least one of the memory components may include a transistor that includes a dipole layer (e.g., an interfacial dipole layer), and at least one of the logic components may include a transistor that does not include a dipole layer. The dipole layer (e.g., HfSiO4) may be formed proximate to a substrate (e.g., a planar substrate or a fin) of the transistor (e.g., a planar field effect transistor (FET) or a FinFET). To form the dipole layer, an oxygen scavenging layer may be formed on a high-k layer (e.g., HfO2) in a gate region of the transistor. The high-k layer may be formed on an interface layer (e.g., SiO2). The dipole layer may be formed by using an annealing process to transform the high-k layer and the interface layer into the dipole layer. The dipole layer may be engineered using a high-k/metal-gate compatible process. In addition to the dipole layer, the transistor of the memory components may include a barrier layer formed on the dipole layer.

The transistor of the at least one logic component may include a gate that includes an interface layer, a dielectric layer, and a cap layer. Additionally, the transistor of the at least one memory component and the transistor of the at least one logic component may be formed using a single process flow, thereby reducing manufacturing costs relative to costs associated with multi-flow processes. One or more transistors of the memory components may be used to form a memory cell that includes a transistor that functions as a pass or access transistor and a transistor to store data. The transistor used to store data may include the dipole layer, and an orientation of a dipole moment of the dipole layer may correspond to information stored by the memory cell. Transistors of the logic components may perform logic operations on or using information stored by the memory cell.

In a particular embodiment, a method of forming a gate stack includes forming an oxygen scavenging layer proximate to a dielectric layer in a gate region of a FET (e.g., a planar FET or a FinFET). The interface layer is between the dielectric layer and a substrate (e.g., a planar substrate or a fin) of the FET. The method further includes forming a dipole layer by annealing the oxygen scavenging layer, the dielectric layer, and the interface layer.

In a particular embodiment, an integrated circuit device includes a first transistor structure formed in a memory region (e.g., an embedded memory region) of a die. The first transistor structure includes a substrate (e.g., a planar substrate of a planar FET or a fin of a FinFET) and a first gate. The first gate includes a dipole layer proximate to the substrate and a barrier layer proximate to the dipole layer. The integrated circuit device further includes a second transistor structure formed in a logic device region of the die. The second transistor structure includes a second gate that includes an interface layer, a dielectric layer, and a cap layer. The dielectric layer is formed between the cap layer and the interface layer.

In a particular embodiment, an integrated circuit device includes means for storing one or more bits formed in an embedded memory region of a die. The means for storing includes a first gate. The first gate includes a dipole layer. The integrated circuit device includes means for implementing a logical function formed in a logic device region of the die. The means for implementing includes a second gate. The second gate includes an interface layer, a dielectric layer, and a cap layer. The dielectric layer is proximate to the interface layer and is located between the cap layer and the interface layer.

In another particular embodiment, a non-transitory computer-readable medium includes processor-executable instructions that, when executed by a processor, cause the processor to initiate fabrication of an integrated circuit device that is fabricated by forming an oxygen scavenging layer proximate to a dielectric layer in a gate region of a FET (e.g., a planar FET or a FinFET). An interface layer is located between the dielectric layer and a substrate (e.g., a planar substrate or a fin) of the FET. The integrated circuit device is further fabricated by forming a dipole layer by annealing the oxygen scavenging layer, the dielectric layer, and the interface layer.

Other aspects and features of the present disclosure will become apparent after review of the entire application, including the following sections: Brief Description of the Drawings, Detailed Description, and the Claims.

IV. BRIEF DESCRIPTION OF THE DRAWINGS

FIG. 2A shows a top view of a particular aspect of a memory device;

FIG. 2B shows a cross-sectional view of the memory device of FIG. 2A;

FIG. 3A shows a top view of a particular aspect of a logic device;

FIG. 3B shows a cross-sectional view of the logic device of FIG. 3A;

FIG. 4A illustrates a top view of a first stage of a process of fabricating the memory device of FIGS. 2A and 2B;

FIG. 4B illustrates a cross-sectional view of the first stage of a process of fabricating the memory device of FIGS. 2A and 2B;

FIG. 5A illustrates a top view of a first stage of a process of fabricating the logic device of FIGS. 3A and 3B;

FIG. 5B illustrates a cross-sectional view of the first stage of a process of fabricating the logic device of FIGS. 3A and 3B;

FIG. 12A illustrates a top view of a fifth stage of a process of fabricating the memory device of FIGS. 2A and 2B;

FIG. 12B illustrates a cross-sectional view of the fifth stage of a process of fabricating the memory device of FIGS. 2A and 2B;

FIG. 13A illustrates a top view of a fifth stage of a process of fabricating the logic device of FIGS. 3A and 3B;

FIG. 13B illustrates a cross-sectional view of the fifth stage of a process of fabricating the memory device of FIGS. 3A and 3B;

FIG. 18A illustrates a top view of an eighth stage of a process of fabricating the memory device of FIGS. 2A and 2B;

FIG. 18B illustrates a cross-sectional view of the eighth stage of a process of fabricating the memory device of FIGS. 2A and 2B;

FIG. 19A illustrates a top view of an eighth stage of a process of fabricating the logic device of FIGS. 3A and 3B;

FIG. 19B illustrates a cross-sectional view of the eighth stage of a process of fabricating the memory device of FIGS. 3A and 3B;

V. DETAILED DESCRIPTION

Figure 1:
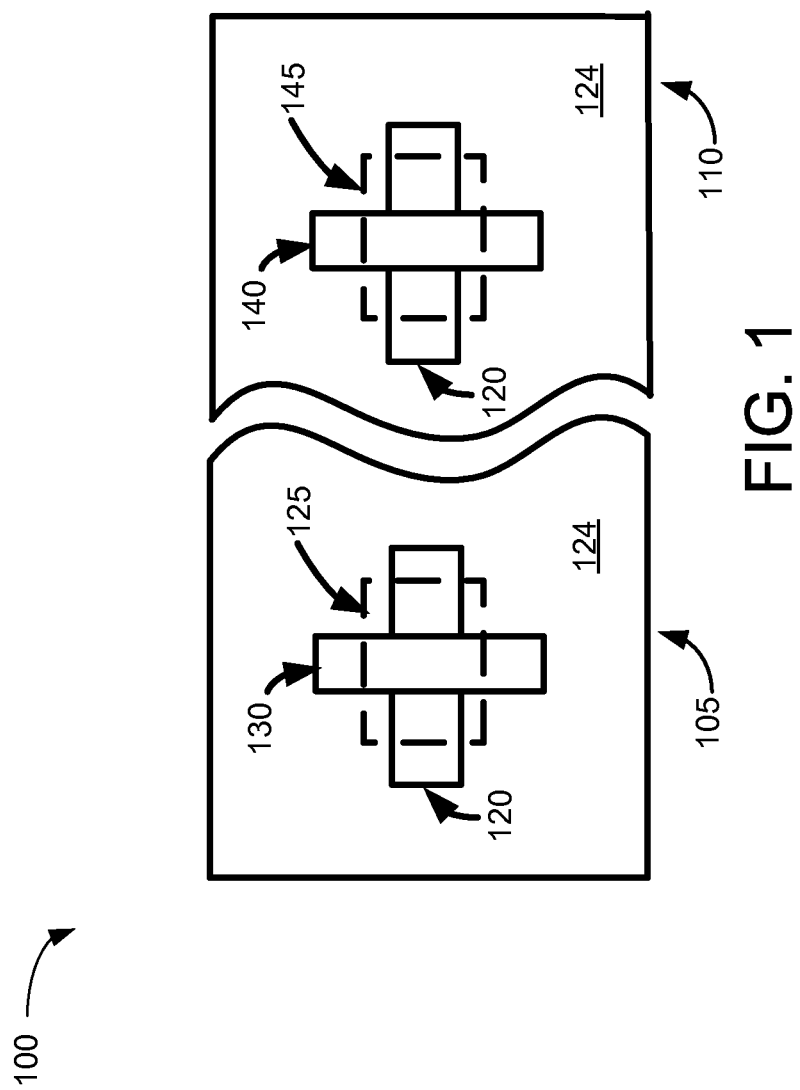
FIG. 1 shows a top view that illustrates a particular aspect of a die that includes a memory device and a logic device.

With reference to FIG. 1, a die 100 (e.g., a semiconductor die of an integrated circuit device) including a memory device 125 in a memory region (e.g., an embedded memory region) 105 of the die 100, and including a logic device 145 in a logic region 110 of the die 100, is generally depicted. The memory device 125 may form or may be included in non-volatile memory (NVM). The memory device 125 (e.g., an "embedded memory device") may be included in embedded memory (e.g., memory integrated on the same die or module as a logic circuit). For example, the embedded memory, which includes the memory device 125, may be embedded non-volatile memory (eNVM). The eNVM may include a transistor-based NVM device integrated on the same die (e.g., the die 100) or module as a logic circuit (e.g., that includes the logic device 145). The memory region 105 of the die 100 may include any one or more regions of the die 100 in which a memory cell is formed. The logic region 110 of the die 100 may include any one or more regions of the die 100 in which a logic cell is formed. The memory region 105 may include at least a portion of a gate region of the memory device 125 and an area proximate to the gate region of the memory device 125. For example, FIG. 2A depicts an example of a memory region (e.g., the memory region 105) that includes at least a portion of a gate region 290, spacers 202 of a memory device 200, and an inter-layer dielectric (ILD) 222 proximate to the gate region 290. A logic device region may include at least a portion of a gate region of the logic device 145 of FIG. 1 and an area proximate to the gate region of the logic device 145. For example, FIG. 3A depicts an example of a logic region (e.g., the logic region 110 of FIG. 1) that includes at least a portion of a gate region 390, the spacers 202 of a logic device 300, and the ILD 222 proximate to the gate region 390.

The memory device 125 of FIG. 1 may include, in the memory region 105, a field effect transistor (FET), such as a planar FET or a FinFET, that includes a substrate 120. The substrate 120 in the memory region may correspond to at least a portion of a planar substrate of a planar FET or to a fin of a FinFET. For example, the substrate 120 in the memory region 105 may correspond to a fin 220 of FIGS. 2A and 2B. A gate (e.g., a "first gate") 130 may correspond to, or may be formed as described with reference to, the gate stack of FIGS. 2A and 2B. The memory device (e.g., a "first transistor structure") 125 of FIG. 1 may correspond to the memory device 200 of FIGS. 2A and 2B. The memory device 125 of FIG. 1 may be at least partially surrounded by an ILD 124. The ILD 124 may be at least partially formed proximate to (e.g., on, above, or over) a shallow trench isolation (STI) region (e.g., a STI 401 of FIG. 4A). The STI region 401 of FIG. 4A may be formed proximate to (e.g., on, above, or over) a substrate [not illustrated]. The memory device 145 of FIG. 1 may include, in the logic region 110, a FET, such as a planar FET or a FinFET, that includes a substrate 120. The substrate 120 in the logic region 110 may correspond to at least a portion of a substrate of a planar FET or to a fin of a FinFET. For example, the substrate 120 in the logic region 110 may correspond to a fin 220 of FIGS. 3A and 3B. A gate (e.g., a "second gate") 140 of FIG. 1 may correspond to, or may be formed as described with reference to, the gate stack of FIGS. 3A and 3B. The logic device (e.g., a "second transistor structure") 145 of FIG. 1 may correspond to the logic device 300 of FIGS. 3A and 3B. The logic device 145 of FIG. 1 may be at least partially surrounded by the ILD 124. The ILD 124 may be at least partially formed proximate to (e.g., on, above, or over) a shallow trench isolation (STI) [not illustrated] region (e.g., a STI 401 of FIG. 5A). The STI region 401 of FIG. 5A may be formed proximate to a substrate [not illustrated]. In some examples, the memory device 125 of FIG. 1 and the logic device 145 are formed proximate to (e.g., on, above, or over) the same substrate [not illustrated].

In some examples, the die 100 may include more than one memory region 105 and/or more than one logic region 110. Additionally or alternatively, a memory region of the die 100, such as the memory region 105, may overlap a logic region of the die 100, such as the logic region 110. Additionally or alternatively, the memory region 105 and/or the logic region 110 may each include other components (such as capacitors), more than one fin, more than one FET, and/or more than one gate. In some embodiments, the geometry, position, and orientation of the gates 130, 140 and the fins 120 (of the memory device 125 and the logic device 145) may differ from the geometries, positions, and orientations of the gates 130, 140 and the fins 120 depicted in FIG. 1. Gate stacks of the first transistor structure 125 and of the second transistor structure 145 are described in more detail with reference to FIGS. 2A, 2B, 3A, and 3B.

FIGS. 2A and 2B show a top view and a cross-sectional view (along line 2 of FIG. 2A), respectively, of a portion of a memory device 200 (e.g., a "first transistor structure"). The memory device 200 may be embedded in an integrated circuit that includes a logic device. FIGS. 3A and 3B show a top view and a cross-sectional view (along line 3 of FIG. 3A), respectively, of a portion of a logic device 300 (e.g., a "second transistor structure"). The memory device 200 illustrated in FIGS. 2A and 2B, and the logic device 300 illustrated in FIGS. 3A and 3B, may be, or may include gate structures of, a ferroelectric (FE) metal-oxide-semiconductor field effect transistor (MOSFET), such as a FE FinFET. The gate stack of the memory device 200 of FIGS. 2A and 2B may be formed in a gate region 290 proximate to the fin 220 (e.g., of a FinFET) of the memory device 200. The gate stack of the logic device 300 of FIGS. 3A and 3B may be formed in a gate region 390 proximate to a fin 220 (e.g., of a second FinFET) of the logic device 300. The logic device 300 of FIGS. 3A and 3B, and the memory device 200 of FIGS. 2A and 2B, each include other portions that are not illustrated, such as a source region and a drain region. The source and drain regions of the memory device 200 of FIGS. 2A and 2B, and the source and drain regions of the logic device 300 of FIGS. 3A and 3B, may be manufactured according to FET manufacturing processes.

Compositionally or structurally similar portions of the memory device 200 of FIGS. 2A and 2B and of the logic device 300 of FIGS. 3A and 3B may be labeled with the same reference number. Use of the same reference number to represent a layer of the memory device 200 of FIGS. 2A and 2B and a layer of the logic device 300 of FIGS. 3A and 3B may indicate that the commonly numbered layers are the same layer (e.g., not physically separate and/or not separately formed), or that the commonly numbered layers are compositionally similar, yet separate (e.g., physically separate and/or separately formed), layers. As an example, the memory device 200 of FIGS. 2A and 2B is illustrated as having a fin 220, and the logic device 300 of FIGS. 3A and 3B is illustrated as having a fin 220. In some embodiments, the fin 220 of the memory device 200 of FIGS. 2A and 2B is the same fin as the fin 220 of the logic device 300 of FIGS. 3A and 3B. In other embodiments, the fin 220 of the memory device 200 of FIGS. 2A and 2B is structurally similar to, though separate from (e.g., not the same component as), the fin 220 of the logic device 300 of FIGS. 3A and 3B. For example, the fin 220 of the memory device 200 of FIGS. 2A and 2B may be a different fin than the fin 220 of the logic device 300 of FIGS. 3A and 3B.

With reference to FIGS. 2A and 2B, the gate stack of the memory device 200 includes a dipole layer 224 between the fin 220 of the memory device 200 and a barrier layer 208. The fin 220 of the memory device 200 may be formed of or include Silicon (Si). The dipole layer 224 may be formed of or include hafnium silicon oxide (HfSiO4), and the barrier layer 208 of the memory device 200 may be formed of or include tantalum nitride (TaN). The gate stack of the memory device 200 may also include a work function metal layer 210 adjacent to the barrier layer 208, and a second barrier layer 212 adjacent to the work function metal layer 210. The work function metal layer 210 may be formed of or include titanium aluminide (TiAl), and the second barrier layer 212 may be formed of or include titanium nitride (TiN). The gate stack of the memory device 200 may also include a fill metal layer 216 adjacent to the second barrier layer 212. The fill metal layer 216 may be formed of or include tungsten (W). Side walls of the gate stack of the memory device 200 may include a dielectric layer 204. The dielectric layer 204 may be formed of or include hafnium oxide (HfO2). The gate stack of the memory device 300 is separated from an ILD 222 by spacers 202.

The dipole layer 224 is a relatively thin layer (e.g., as compared to a ferroelectric dipole layer used for other embedded memory devices). The dipole layer 224 forms a dipole 228 between the fin 220 of the memory device 200 and the work function metal layer 210 of the memory device 200. The dipole layer 224 may exhibit a large dipole 228 that is suitable for use with NVM devices. An orientation of a dipole moment of the dipole 228 can be changed based on a voltage applied to the gate stack of the memory device 200. In some examples, switching the dipole moment of the dipole 228 may generate a flat-band shift of approximately 0.5-1 volts (e.g., for a NVM application). For example, an orientation of the dipole moment of the dipole 228 may be changed by applying a voltage difference between the fill metal layer 216 and the fin 220 of the memory device 200. An orientation of the dipole moment of the dipole 228 may correspond to data stored in the memory device 200. Further, a threshold voltage of the memory device 200 may change depending on an orientation of the dipole moment of the dipole 228. Additionally, the orientation of the dipole moment of the dipole 228 is a non-volatile property. Thus, the dipole layer 224 enables use of the memory device 200 as a NVM to store data.

The memory device 200 may, alone or in conjunction with one or more other devices, be used to form a high-k interfacial dipole embedded memory cell. For example, an embedded memory cell may include two or more transistors per cell, and one or more of the two or more transistors may be the memory device 200 of FIGS. 2A and 2B or may include a gate stack corresponding to the gate stack of the memory device 200 of FIGS. 2A and 2B. When the embedded memory cell includes two or more transistors, one of the two or more transistors may function as a pass transistor (e.g., a logic transistor of FIG. 3A or 3B) and another of the two or more transistors may function to store data (e.g., using an orientation of the dipole 228 of the dipole layer 224) as described above. Thus, during operation, the memory device 200 may function as a data storage component of an embedded memory cell.

With reference to FIGS. 3A and 3B, the gate stack of the logic device 300 is separated from an ILD 222 via spacers 202. The gate stack of the logic device 300 includes an interface layer 214 between the fin 220 of the logic device 300 and a dielectric layer 204. In a particular embodiment, the interface layer 214 of the logic device 300 is formed of or includes silicon oxide (SiO2), the fin 220 of the logic device 300 is formed of or includes silicon (Si), and the dielectric layer 204 of the logic device 300 is formed of or includes hafnium oxide (HfO2). The gate stack of the logic device 300 includes a cap layer 206 and a barrier layer 208 between the dielectric layer 204 and a work function metal layer 210. In a particular embodiment, the work function metal layer 210 is formed of or includes titanium aluminide (TiAl), the cap layer 206 is formed of or includes titanium nitride (TiN), and the barrier layer 208 is formed of or includes tantalum nitride (TaN). The gate stack of the logic device 300 may also include a second barrier layer 212 adjacent to the work function metal layer 210 and a fill metal layer 216 adjacent to the second barrier layer 212. In a particular embodiment, the second barrier layer 212 is formed of or includes titanium nitride (TiN), and the fill metal layer 216 is formed of or includes tungsten (W).

The gate stacks of the memory device 200 of FIGS. 2A and 2B and the logic device 300 of FIGS. 3A and 3B may be formed concurrently, using similar processing techniques, thus enabling formation of a single die including logic (e.g., logic devices or a logic circuit) and embedded memory without distinct process flows for each of the embedded memory portion and the logic device portion. FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, and 19B illustrate a fabrication process to form the gate stacks of the memory device 200 of FIGS. 2A and 2B and the logic device 300 of FIGS. 3A and 3B.

FIGS. 4A and 4B illustrate a top view and a cross-sectional view (along line 4 of FIG. 4A), respectively, of an intermediate structure 400 associated with a first stage during formation of a gate stack of the memory device 200 of FIGS. 2A and 2B. FIGS. 5A and 5B illustrate a top view and a cross-sectional view (along line 5 of FIG. 5A), respectively, of an intermediate structure 500 associated with a first stage during formation of a gate stack of the logic device 300 of FIGS. 3A and 3B.

The first stage may include forming a dummy oxide layer 404 (e.g., SiO2) between spacers 202 of the intermediate structure 400 and between spacers 202 of the intermediate structure 500. A dummy fill layer 402 (e.g., dummy poly Si) may be formed proximate to (e.g., on, above, or over) the dummy oxide layer 404 of the intermediate structure 400 to fill an area between the spacers 202 of the intermediate structure 400. The dummy fill layer 402 is additionally formed proximate to (e.g., on, above, or over) the dummy oxide layer 404 of the intermediate structure 500 to fill an area between the spacers 202 of the intermediate structure 500. The process step(s) illustrated using, and described with reference to, FIGS. 4A, 4B, 5A, and 5B may be concurrently performed for both the logic devices and the memory devices. For example, the dummy fill layer 402 of FIGS. 4A, 4B, 5A, and 5B may be deposited on the entire die 100 of FIG. 1. Thus, forming the dummy fill layer 402 proximate to the dummy oxide layer 404 of the intermediate structure 400 during the first stage of forming the memory device 200 may be performed using the same deposition step or steps as forming the dummy fill layer 402 proximate to the dummy oxide layer 404 of the intermediate structure 500 during the first stage of forming the logic device 300.

Figure 6A:
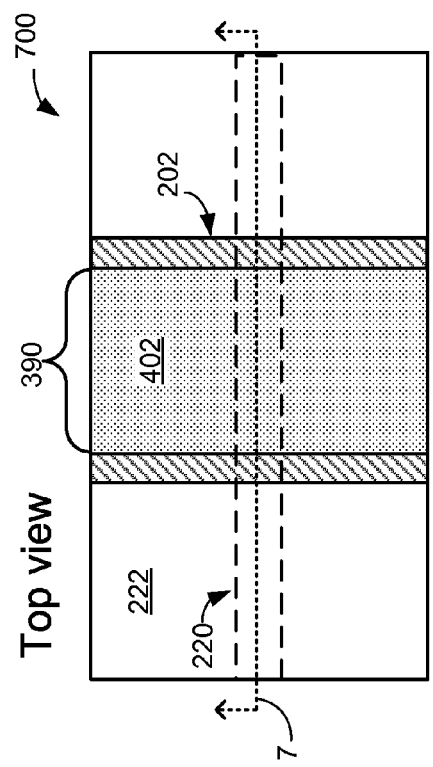
FIG. 6A illustrates a top view of a second stage of a process of fabricating the memory device of FIGS. 2A and 2B.
Figure 6B:
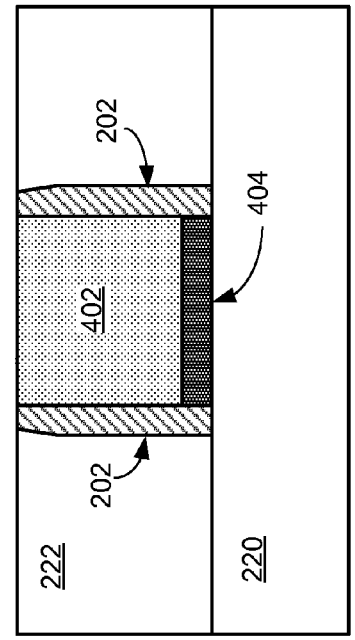
FIG. 6B illustrates a cross-sectional view of the second stage of a process of fabricating the memory device of FIGS. 2A and 2B.
Figure 7A:
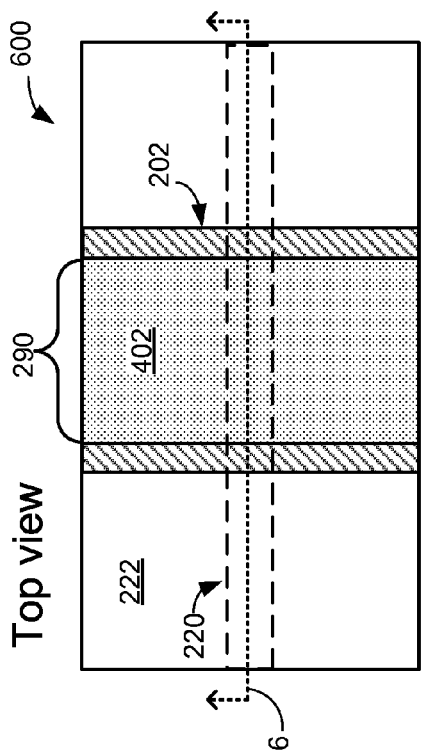
FIG. 7A illustrates a top view of a second stage of a process of fabricating the logic device of FIGS. 3A and 3B.
Figure 7B:
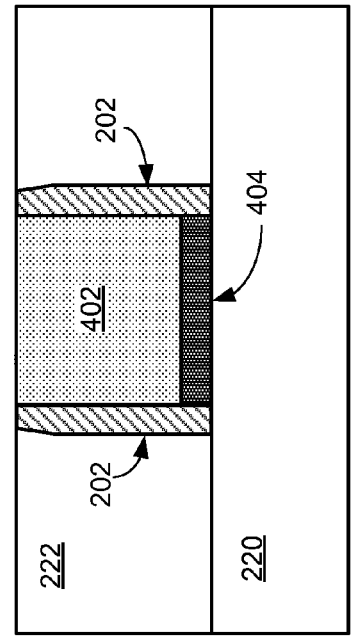
FIG. 7B illustrates a cross-sectional view of the second stage of a process of fabricating the logic device of FIGS. 3A and 3B.

FIGS. 6A and 6B illustrate a top view and a cross-sectional view (along line 6 of FIG. 6A), respectively, of an intermediate structure 600 during a second stage of forming a gate stack of the memory device 200 of FIGS. 2A and 2B. FIGS. 7A and 7B illustrate a top view and a cross-sectional view (along line 7 of FIG. 7A), respectively, of an intermediate structure 700 during a second stage of forming a gate stack of the logic device 300 of FIGS. 3A and 3B. The second stage illustrated in FIGS. 6A, 6B, 7A, and 7B may be subsequent to the first stage illustrated in FIGS. 4A, 4B, 5A, and 5B.

During the second stage, the ILD 222 may be deposited in the memory region (e.g., the memory region 105 of FIG. 1) and in the logic region (e.g., the logic region 110 of FIG. 1). For example, the ILD 222 may be deposited proximate to the spacers 202, the fin 220, and the STI (e.g., 401 of FIG. 4A), of the intermediate structure 600 of FIGS. 6A and 6B. Additionally, the ILD 222 may be deposited proximate to the spacers 202, the fin 220, and the STI (e.g., 401 of FIG. 5A), of the intermediate structure 700 of FIGS. 7A and 7B.

The ILD 222 formed in the memory region 105 of FIG. 1 (e.g., proximate to the intermediate structure 400 of FIG. 4A) and the ILD 222 formed in the logic region 110 of FIG. 1 (e.g., proximate to the intermediate structure 500 of FIG. 5A) may be planarized (e.g. using a chemical mechanical polish (CMP) process). The process step(s) illustrated using, and described with reference to, FIGS. 6A, 6B, 7A, and 7B may be concurrently performed for both the logic devices and the memory devices. For example, the ILD 222 may be deposited on the entire die 100 of FIG. 1. Thus, forming the ILD 222 (of FIGS. 6A and 6B) of the intermediate structure 600 during the second stage of forming the memory device 200 of FIGS. 2A and 2B may be performed using the same deposition step or steps as forming the ILD 222 (of FIGS. 7A and 7B) of the intermediate structure 700 during the first stage of forming the logic device 300 of FIGS. 3A and 3B.

Figure 8A:
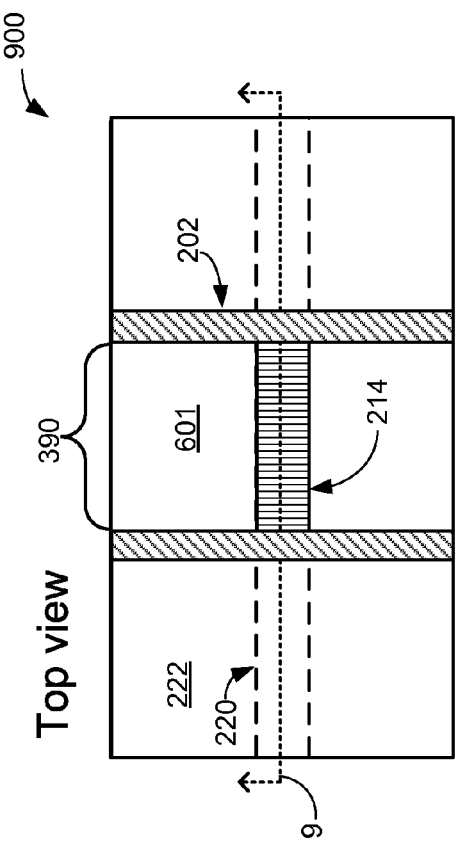
FIG. 8A illustrates a top view of a third stage of a process of fabricating the memory device of FIGS. 2A and 2B.
Figure 8B:
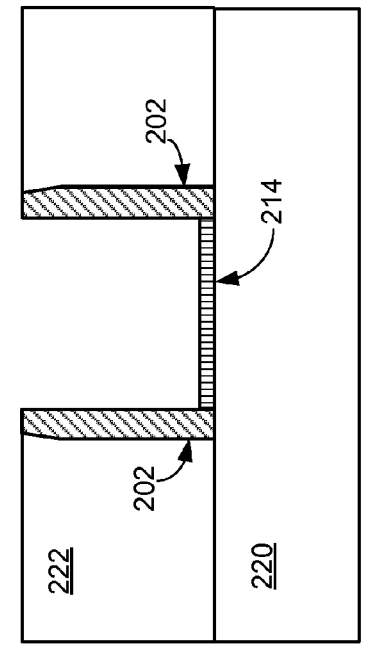
FIG. 8B illustrates a cross-sectional view of the third stage of a process of fabricating the memory device of FIGS. 2A and 2B.
Figure 9A:
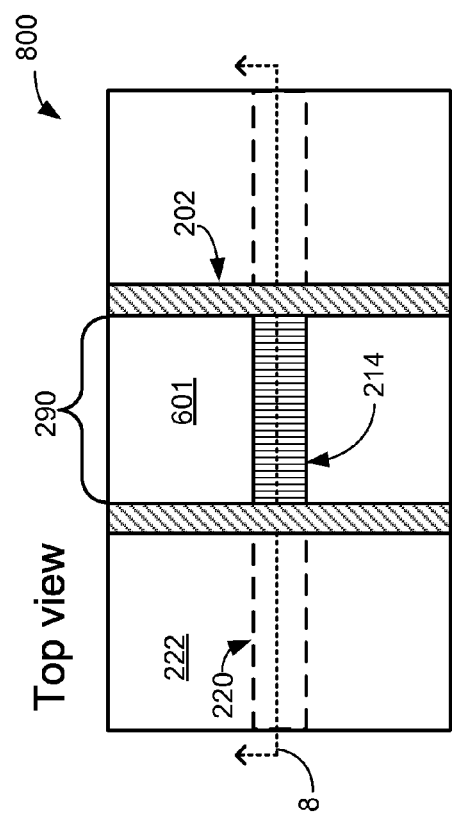
FIG. 9A illustrates a top view of a third stage of a process of fabricating the logic device of FIGS. 3A and 3B.
Figure 9B:
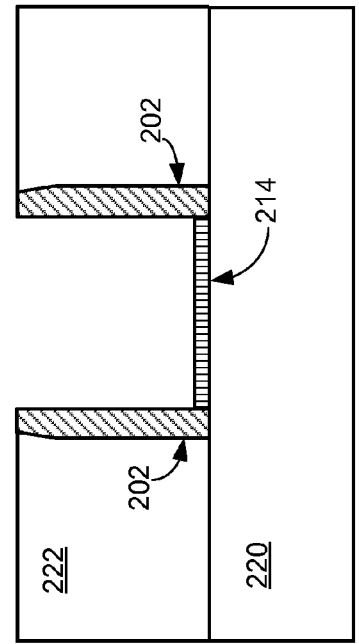
FIG. 9B illustrates a cross-sectional view of the third stage of a process of fabricating the logic device of FIGS. 3A and 3B.

FIGS. 8A and 8B illustrate a top view and a cross-sectional view (along line 8 of FIG. 8A), respectively, of an intermediate structure 800 during a third stage of forming a gate stack of the memory device 200 of FIGS. 2A and 2B. FIGS. 9A and 9B illustrate a top view and a cross-sectional view (along line 9 of FIG. 9A), respectively, of an intermediate structure 900 during a third stage of forming a gate stack of the logic device 300 of FIGS. 3A and 3B. The third stage illustrated using FIGS. 8A, 8B, 9A, and 9B may be subsequent to the second stage illustrated using FIGS. 6A, 6B, 7A, and 7B. In the third stage, the dummy fill layer 402 and the dummy oxide layer 404 of the intermediate structures 600 and 700 of FIGS. 6A, 6B, 7A, and 7B are removed (e.g., using an etch process).

Additionally, during the third stage, the interface layer 214 of the intermediate structure 800 of FIGS. 8A and 8B is formed proximate to (e.g., on, over, or above) the fin 220 of the intermediate structure 800. The interface layer 214 of the intermediate structure 900 of FIGS. 9A and 9B is formed proximate to (e.g., on, over, or above) the fin 220 of the intermediate structure 900. As an example, the interface layer 214 of the intermediate structure 800 of FIGS. 8A and 8B, and the interface layer 214 of the intermediate structure 900 of FIGS. 9A and 9B, may be formed using an oxidation process. With reference to FIGS. 8A and 8B, a STI 601 may be located proximate to the fin 220 of the intermediate structure 800. With reference to FIGS. 9A and 9B, a STI 601 may be located proximate to the fin 220 of the intermediate structure 900. The interface layer 214 of the intermediate structure 800 of FIGS. 8A and 8B, and the interface layer 214 of the intermediate structure 900 of the intermediate structure 9A and 9B, may be formed of or include SiO2.

The process step(s) illustrated using, and described with reference to, FIGS. 8A, 8B, 9A, and 9B may be concurrently performed for both the logic devices and the memory devices. For example, the die (e.g., the entire die) 100 of FIG. 1 may be etched to remove dummy fill layer 402 and/or the dummy oxide layer 404 of the intermediate structure 600 of FIGS. 6A and 6B and to remove the dummy oxide layer 404 of the intermediate structure 700 of FIGS. 7A and 7B. Thus, the dummy fill layer 402 and the dummy oxide layer 404 of the intermediate structure 600 of FIGS. 6A and 6B may be removed using the same etch step or steps used to remove the dummy fill layer 402 and/or the dummy oxide layer 404 of the intermediate structure 700 of FIGS. 7A and 7B. As another example, a growth-inhibiting (e.g., spin on dielectric (SOD)) mask layer may be selectively deposited on the die 100 of FIG. 1 such that the growth-inhibiting mask layer is not formed proximate to (e.g., on, above, or over) the fin 220 in the gate region 290 of the intermediate structure 600 of FIGS. 6A and 6B, and is not formed proximate to (e.g., on, above, or over) the fin 220 in the gate region 390 of the intermediate structure 700 of FIGS. 7A and 7B. An oxide process may then be performed on the entire die 100 of FIG. 1 to form the interface layer 214 of the intermediate structure 800 of FIGS. 8A and 8B, and to form the interface layer 214 of the intermediate structure 900 of FIGS. 9A and 9B in areas of the die 100 of FIG. 1 that do not include the growth-inhibiting mask layer. Thus, the interface layer 214 formed proximate to the fin 220 of the intermediate structure 800 of FIGS. 8A and 8B (e.g., the interface layer used to form the dipole layer 224 of the memory device 200 of FIGS. 2A and 2B) may be formed concurrently with (e.g., during the same ALD deposition process as) the fabrication step or steps used to form the interface layer 214 of the intermediate structure 900 of FIGS. 9A and 9B (e.g., the interface layer of the logic device 300 of FIGS. 3A and 3B).

Figure 10A:
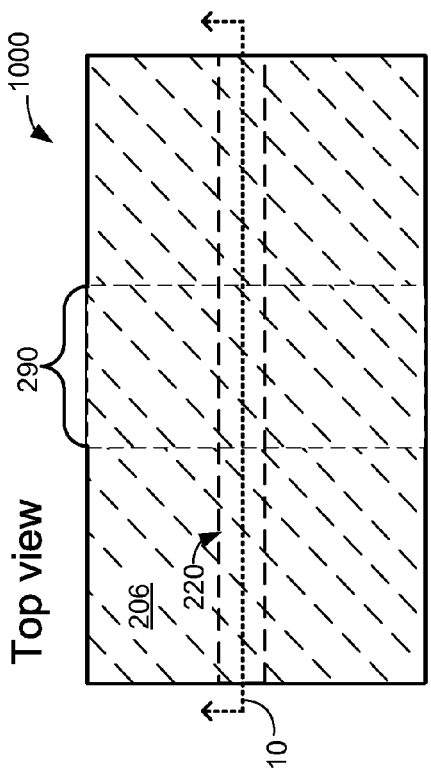
FIG. 10A illustrates a top view of a fourth stage of a process of fabricating the memory device of FIGS. 2A and 2B.
Figure 10B:
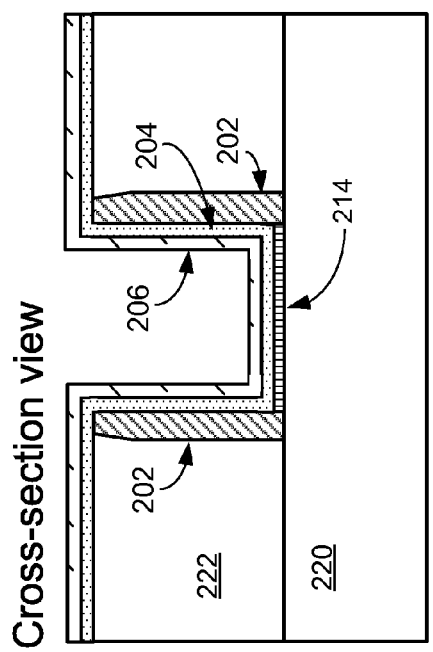
FIG. 10B illustrates a cross-sectional view of the fourth stage of a process of fabricating the memory device of FIGS. 2A and 2B.
Figure 11A:
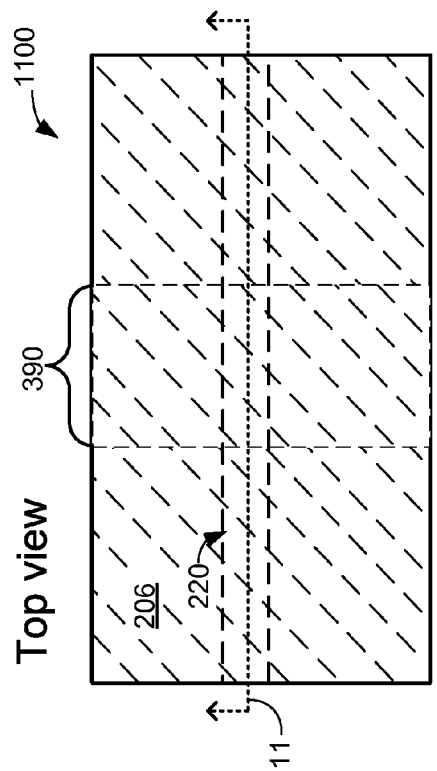
FIG. 11A illustrates a top view of a fourth stage of a process of fabricating the logic device of FIGS. 3A and 3B.
Figure 11B:
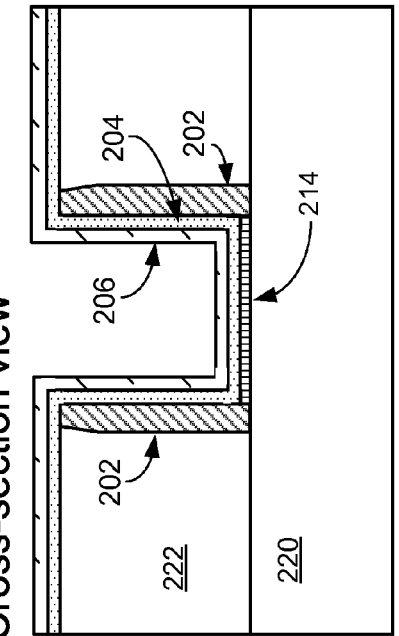
FIG. 11B illustrates a cross-sectional view of the fourth stage of a process of fabricating the logic device of FIGS. 3A and 3B.

FIGS. 10A and 10B illustrate a top view and a cross-sectional view (along line 10 of FIG. 10A), respectively, of an intermediate structure 1000 during a fourth stage of forming a gate stack of the memory device 200 of FIGS. 2A and 3B. FIGS. 11A and 11B illustrate a top view and a cross-sectional view (along line 11 of FIG. 11A), respectively, of an intermediate structure 1100 during a fourth stage of forming a gate stack of the logic device 300 of FIGS. 3A and 3B. The fourth stage illustrated using FIGS. 10A, 10B, 11A, and 11B may be performed subsequent to the third stage illustrated using FIGS. 8A, 8B, 9A, and 9B. During the fourth stage, the dielectric layer 204 of the intermediate structure 1000 of FIGS. 10A and 10B, and the dielectric layer 204 of the intermediate structure 1100 of FIGS. 11A and 11B, is formed. The cap layer 206 is formed proximate to the dielectric layer 204 of the intermediate structure 1000 of FIGS. 10A and 10B, and the cap layer 206 is formed proximate to the dielectric layer 204 of the intermediate structure 1100 of FIGS. 11A and 11B. The dielectric layer 204 of the intermediate structure 1000 of FIGS. 10A and 10B, and the dielectric layer 204 of the intermediate structure 1100 of FIGS. 11A and 11B, may be formed using one or more deposition processes, such as a sequential deposition process (e.g., an ALD process). Additionally or alternatively, the cap layer 206 of the intermediate structure 1100 of FIGS. 11A and 11B, and the cap layer 206 proximate to the dielectric layer 204 of the intermediate structure 1000 of FIGS. 10A and 10B, may be formed using sequential deposition processes, such as an ALD process. The dielectric layer 204 of the intermediate structure 1000 of FIGS. 10A and 10B and the dielectric layer 204 of the intermediate structure 1100 of FIGS. 11A and 11B may be formed of or include hafnium oxide (HfO2). The cap layer 206 proximate to the dielectric layer 204 of the intermediate structure 1000 of FIGS. 10A and 10B and the cap layer 206 of the intermediate structure 1100 of FIGS. 11A and 11B may be formed of or include titanium nitride (TiN).

The process step(s) illustrated using, and described with reference to, FIGS. 10A, 10B, 11A, and 11B may be concurrently performed for both the logic devices and the memory devices. For example, a first ALD process may be performed on the entire die 100 of FIG. 1 to concurrently form the dielectric layer 204 of the intermediate structure 1000 of FIGS. 10A and 10B and to form the dielectric layer 204 of the intermediate structure 1100 of FIGS. 11A and 11B. Thus, the dielectric layer 204 of the intermediate structure 1000 of FIGS. 10A and 10B (e.g., the dielectric layer 204 used to form the dipole layer 224 of the memory device 200 of FIGS. 2A and 2B) may be formed during the fabrication step or steps used to form the dielectric layer 204 of the intermediate structure 1100 of FIGS. 11A and 11B (e.g., the dielectric layer 204 of the logic device 300 of FIGS. 3A and 3B). Additionally or alternatively, a second ALD process may be performed on the entire die 100 to concurrently form the cap layer 206 of the intermediate structure 1000 of the memory device 200 and the cap layer 206 of the intermediate structure 1100 of the logic device 300. Thus, the cap layer 206 of the intermediate structure 1000 of the memory device 200 (e.g., the cap layer 206 applied to an intermediate structure of the memory device 200 of FIGS. 2A and 2B) may be formed during the fabrication step or steps used to form the cap layer 206 of the intermediate structure 1100 of FIGS. 11A and 11B (e.g., the cap layer 206 of the logic device 300 of FIGS. 3A and 3B).

FIGS. 12A and 12B illustrate a top view and a cross-sectional view (along line 12 of FIG. 12A), respectively, of an intermediate structure 1200 during a fifth stage of forming a gate stack of the memory device 200 of FIGS. 2A and 2B. FIGS. 13A and 13B illustrate a top view and a cross-sectional view (along line 13 of FIG. 13A), respectively, of an intermediate structure 900 during a fifth stage of forming a gate stack of the logic device 300 of FIGS. 3A and 3B. The fifth stage illustrated using FIGS. 12A, 12B, 13A, and 13B may be subsequent to the fourth stage illustrated using FIGS. 10A, 10B, 11A, and 11B.

During the fifth stage, a dielectric layer 920 (e.g., a "protective layer") may be formed. In some examples, the dielectric layer 920 may be formed of or include a low-k material or other masking material. In some examples, the dielectric layer 920 may be formed of or include a spin-on dielectric (SOD) material, such as an oxide dielectric. The SOD material may be deposited using a spin coating procedure. In some examples, the dielectric layer 920 is applied to a logic region (e.g., 110 of FIG. 1) of the die 100, and not applied to a memory region (e.g., 105 of FIG. 1) of the die 100. For example, the dielectric layer 920 may be deposited proximate to logic devices, such as the logic device 145, and removed proximate to memory devices by etch process, such as the memory device 125. In these examples, the memory devices may be masked (e.g., using a patterned photoresist layer [not illustrated]) to prevent formation of the dielectric layer 920 in the memory region 105.

Alternatively, the dielectric layer 920 may be formed on the entire die 100 (e.g., in the logic region 110 of and in the memory region 105), and may be subsequently removed from at least a portion of the memory region 105 (e.g., proximate to the memory device 125), using an etch process. For example, the dielectric layer 920 may be formed proximate to an intermediate structure of the logic devices, such as the intermediate structure 1100 of FIGS. 11A and 11B, and proximate to an intermediate structure of the memory devices, such as the intermediate structure 1000 of FIGS. 10A and 10B. A patterned etch mask [not illustrated] may then be formed proximate to the dielectric layer 920. At least a portion of the dielectric layer 920 in the memory region 105 of FIG. 1 (e.g., the dielectric layer 920 of the intermediate structure 1000 of FIGS. 10A and 10B) may be etched through the patterned etch mask, thereby exposing the cap layer 206 of the intermediate structure 1000 of FIGS. 10A and 10B (e.g., an intermediate structure of the memory device 200 of FIGS. 2A and 2B) without removing the dielectric layer 920 of intermediate structure 1300 of FIGS. 13A and 13B.

During the fifth stage, the cap layer 206 of the intermediate structure 1000 of FIGS. 10A and 10B (e.g., in the memory region 105 of FIG. 1) may be removed. The cap layer 206 of the intermediate structure 1000 of FIGS. 10A and 10B may be removed using an etch process, such as standard clean 1 (SC-1) or standard clean 2 (SC-2). The cap layer 206 may exhibit high etch-selectivity with respect to the material of the dielectric layer 920. The dielectric layer 920 of the intermediate structure 1300 of FIGS. 13A and 13B may operate as an etch-stop layer or a mask layer when etching the cap layer 206 of the intermediate structure 1000 of FIGS. 10A and 10B (e.g., in the memory region 105 of FIG. 1). Thus, the cap layer 206 of the intermediate structure 1000 of FIGS. 10A and 10B (e.g., in the memory region 105 of FIG. 1) may be etched or removed to form the intermediate structure 1200 of FIGS. 12A and 12B, and the cap layer 206 of the intermediate structure 1100 and 1300 of FIGS. 11A, 11B, 13A, and 13B (e.g., in the logic region 110 of FIG. 1) may not be etched or removed.

Figure 15A:
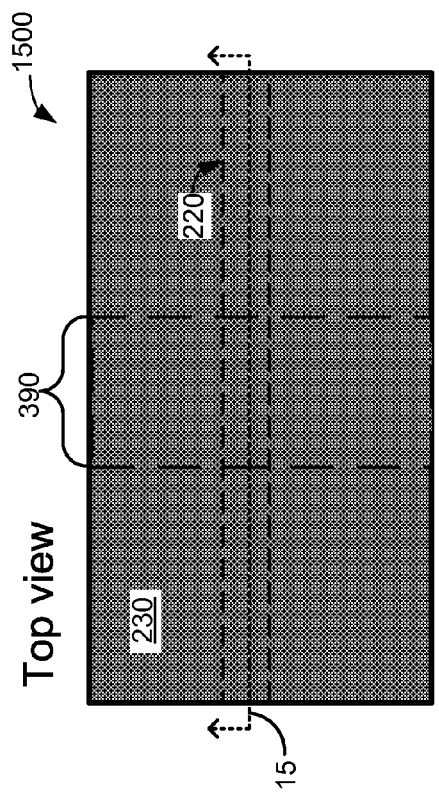
FIG. 15A illustrates a top view of a sixth stage of a process of fabricating the logic device of FIGS. 3A and 3B.
Figure 15B:
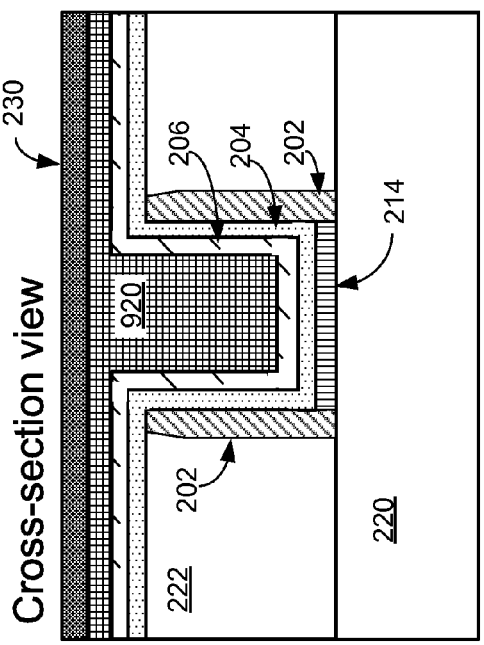
FIG. 15B illustrates a cross-sectional view of the sixth stage of a process of fabricating the memory device of FIGS. 3A and 3B.
Figure 14A:
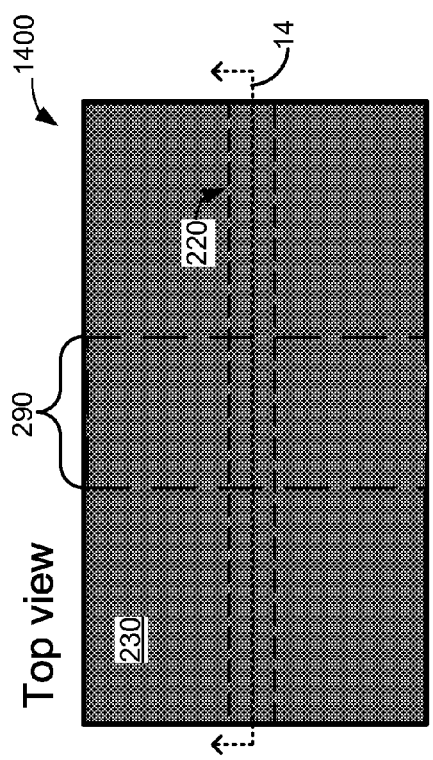
FIG. 14A illustrates a top view of a sixth stage of a process of fabricating the memory device of FIGS. 2A and 2B.
Figure 14B:
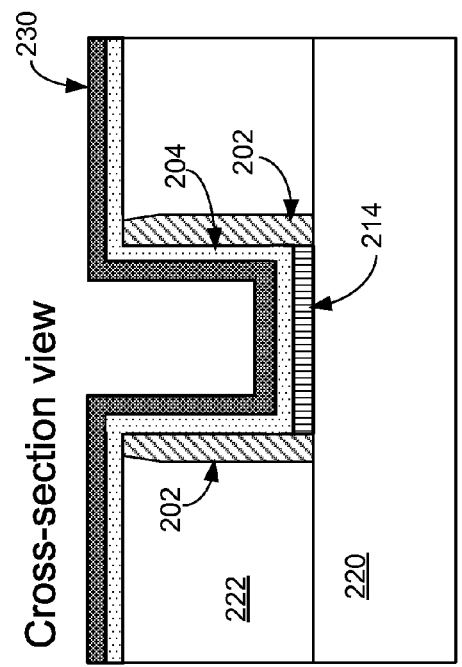
FIG. 14B illustrates a cross-sectional view of the sixth stage of a process of fabricating the memory device of FIGS. 2A and 2B.

FIGS. 14A and 14B illustrate a top view and a cross-sectional view (along line 14 of FIG. 14A), respectively, of an intermediate structure 1400 during a sixth stage of forming the gate stack of the memory device 200 of FIGS. 2A and 2B. FIGS. 15A and 15B illustrate a top view and a cross-sectional view (along line 15 of FIG. 15A), respectively, during a sixth stage of forming the gate stack of the logic device 300 of FIGS. 3A and 3B. The sixth stage may be subsequent to the fifth stage illustrated in FIGS. 12A, 12B, 13A, and 13B. During the sixth stage, an oxygen scavenging layer 230 of FIGS. 12A, 12B, 13A, and 13B may be formed in the memory region 105 of FIG. 1 (e.g., proximate to the dielectric layer 204 of the intermediate structure 1200 of FIGS. 12A and 12B) and in the logic region 110 of FIG. 1 (e.g., proximate to the dielectric layer 204 of the intermediate structure 1300 of FIGS. 13A and 13B). The oxygen scavenging layer 230 formed in the memory region 105 of FIG. 1 may directly contact the dielectric layer 204 formed in the memory region 105 of FIG. 1. For example, the oxygen scavenging layer 230 in the memory region 105 of FIG. 1 may directly contact the dielectric layer 204 formed in the gate region 290 of the intermediate structure 1400 of the memory device 200. The oxygen scavenging layer 230 formed in the logic region 110 of FIG. 1 may not contact the dielectric layer 204 formed in the logic region 110 of FIG. 1. For example, the dielectric layer 920 and the cap layer 206 of the intermediate structure 1500 of FIGS. 15A and 15B may be formed between the oxygen scavenging layer 230 and the dielectric layer 204 of the intermediate structure 1500. Thus, the oxygen scavenging layer 230 of the intermediate structure 1400 of FIGS. 14A and 14B (e.g., an intermediate structure of the memory device 200 of FIGS. 2A and 2B) may directly contact the dielectric layer 204 of the intermediate structure 1400 of FIGS. 14A and 14B, and the oxygen scavenging layer 230 the intermediate structure 1500 of FIGS. 15A and 15B (e.g., an intermediate structure of the logic device 300 of FIGS. 3A and 3B) may be separated from the dielectric layer 204 of the intermediate structure 1500 of FIGS. 15A and 15B.

The oxygen scavenging layer 230 of the intermediate structure 1400 of FIGS. 14A and 14B, and the oxygen scavenging layer 230 of the intermediate structure 1500 of FIGS. 15A and 15B, may be formed of or include a titanium-rich titanium nitride material (e.g., $TiN_{1-x}$). The oxygen scavenging layer 230 of the intermediate structure 1400 of FIGS. 14A and 14B, and the oxygen scavenging layer 230 of the intermediate structure 1500 of FIGS. 15A and 15B may be deposited using a chemical vapor deposition (CVD) or plasma vapor deposition (PVD) process with a non-stoichiometric mixture of titanium and nitrogen, such that insufficient nitrogen is present to combine stoichiometrically with the titanium. The oxygen scavenging layer 230 of the intermediate structure 1400 of FIGS. 14A and 14B and the oxygen scavenging layer 230 of the intermediate structure 1500 of FIGS. 15A and 15B may be formed by depositing the oxygen scavenging layer 230 over the entire die 100 of FIG. 1. Thus, the oxygen scavenging layer 230 of the intermediate structure 1400 of FIGS. 14A and 14B (e.g., an intermediate structure of the memory device 200 of FIGS. 2A and 2B) may be formed during the fabrication step or steps used to form the oxygen scavenging layer 230 of the intermediate structure 1500 of FIGS. 15A and 15B (e.g., an intermediate structure of the logic device 300 of FIGS. 3A and 3B).

Figure 17A:
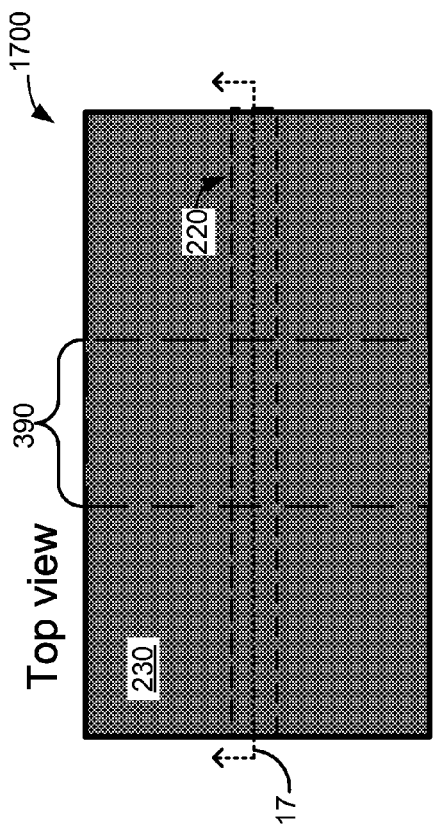
FIG. 17A illustrates a top view of a seventh stage of a process of fabricating the logic device of FIGS. 3A and 3B.
Figure 17B:
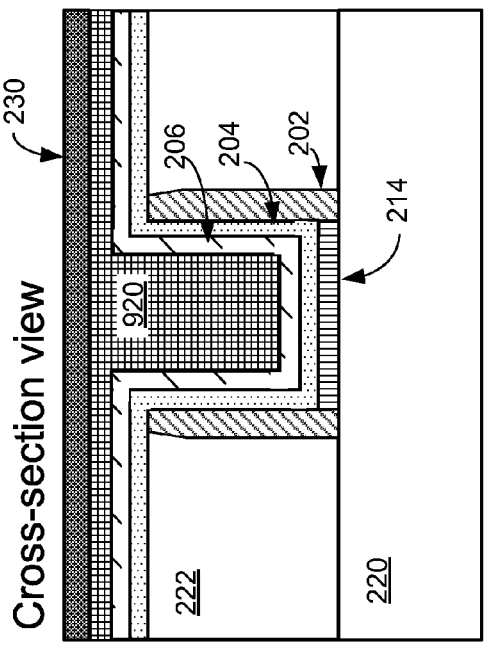
FIG. 17B illustrates a cross-sectional view of the seventh stage of a process of fabricating the memory device of FIGS. 3A and 3B.
Figure 16A:
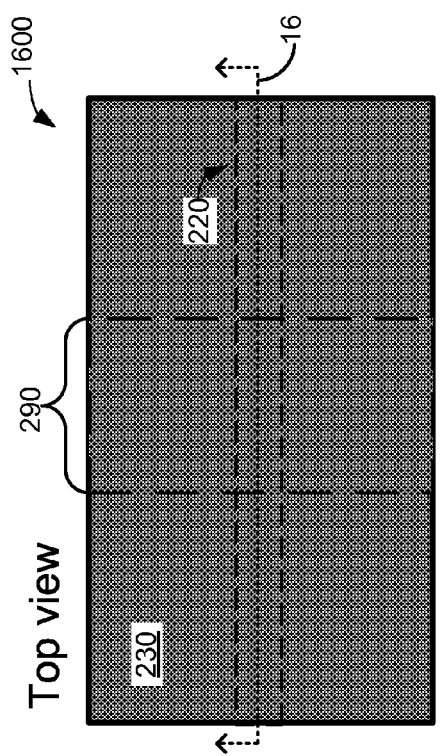
FIG. 16A illustrates a top view of a seventh stage of a process of fabricating the memory device of FIGS. 2A and 2B.
Figure 16B:
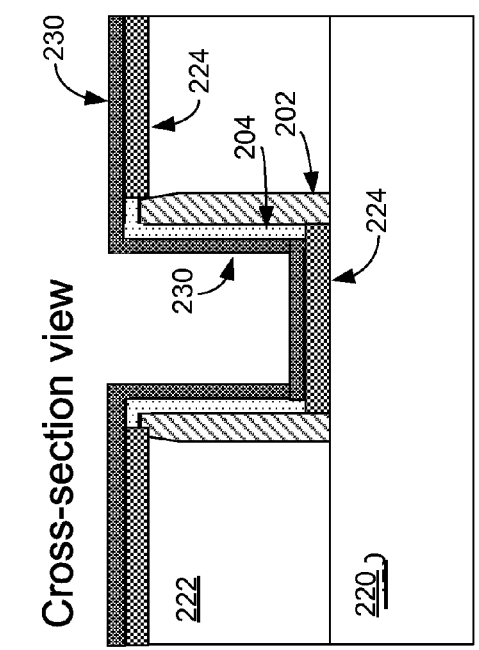
FIG. 16B illustrates a cross-sectional view of the seventh stage of a process of fabricating the memory device of FIGS. 2A and 2B.

FIGS. 16A and 16B illustrate a top view and a cross-sectional view (along line 16 of FIG. 16A), respectively, of an intermediate structure 1600 during a seventh stage of forming the gate stack of the memory device 200 of FIGS. 2A and 2B. FIGS. 17A and 17B illustrate a top view and a cross-sectional view (along line 17 of FIG. 17A), respectively, of an intermediate structure 1700 during a seventh stage of forming the gate stack of the logic device 300 of FIGS. 3A and 3B. The seventh stage may be subsequent to the sixth stage illustrated in FIGS. 14A, 14B, 15A, and 15B.

During the seventh stage, a low-temperature (e.g., less than 400 deg. C.) anneal process may be performed. The low-temperature anneal process may cause the oxygen scavenging layer 230 of the memory region 105 of FIG. 1 (e.g., in the gate region 290 of the intermediate structure 1400 of FIGS. 14A and 14B) to strip oxygen from the dielectric layer 204 of the memory region (e.g., in the gate region 290 of the intermediate structure 1400). In areas where the dielectric layer 204 of the intermediate structure 1400 is in contact with the oxygen scavenging layer 230 and the interface layer 214, the oxygen scavenging may lead to formation of the dipole layer 224 of FIGS. 16A and 16B in the gate region 290 of the intermediate structure 1600 proximate to the fin 220 of the intermediate structure 1600. For example, the titanium of the oxygen scavenging layer 230 may have a stronger affinity for oxygen than does the hafnium of the dielectric layer 204. Accordingly, in areas where the oxygen scavenging layer 230 and the dielectric layer 204 are in direct contact, such as in the intermediate structure 1400 of FIGS. 14A and 14B, the titanium of the oxygen scavenging layer 230 may strip oxygen from the dielectric layer 204. The hafnium of the dielectric layer 204 of the intermediate structure 1400 (after having oxygen stripped away) may have a stronger affinity for oxygen than the silicon of the interface layer 214 of the intermediate structure 1400. Accordingly, the hafnium of the dielectric layer 204 of the intermediate structure 1400 may interact with the silicon dioxide of the interface layer 214 of the intermediate structure 1400 to form HfSiO4 of the dipole layer 224 of the intermediate structure 1600 of FIGS. 16A and 16B. In contrast, as the dielectric layer 204 of the intermediate structure 1700 of FIGS. 17A and 17B is not in contact with the oxygen scavenging layer 230 of the intermediate structure 1700, the dielectric layer 204 of the intermediate structure 1700 may not interact with the interface layer 214 of the intermediate structure 1700 to form a dipole layer in response to the annealing process. Thus, a dipole layer 224 may be formed in the memory device 200 of FIGS. 2A and 2B, and may not be formed in the logic device 300 of FIGS. 3A and 3B.

FIGS. 18A and 18B illustrate a top view and a cross-sectional view (along line 18 of FIG. 18A), respectively, of an intermediate structure 1800 during an eighth stage of forming the gate stack of the memory device 200 of FIGS. 2A and 2B. FIGS. 19A and 19B illustrate a top view and a cross-sectional view (along line 19 of FIG. 19A), respectively, of an intermediate structure 1900 during an eighth stage of forming the gate stack of the logic device 300 of FIGS. 3A and 3B. The eighth stage may be subsequent to the seventh stage illustrated in FIGS. 16A, 16B, 17A, and 17B. In the eighth stage, the oxygen scavenging layer 230 in both the memory region 105 of FIG. 1 and in the logic region 110 of FIG. 1 may be removed. For example, during the eighth stage, the oxygen scavenging layer 230 of the intermediate structure 1600 of FIGS. 16A and 16B, and the oxygen scavenging layer 230 of the intermediate structure 1700 of FIGS. 17A and 17B may be removed. Additionally, during the eighth stage, the dielectric layer 920 of the intermediate structure 1700 of FIGS. 17A and 17B may be removed. The oxygen scavenging layer 230 of the intermediate structure 1600 of FIGS. 16A and 16B, and the oxygen scavenging layer 230 of the intermediate structure 1700 of FIGS. 17A and 17B may be removed using SC-1 or SC-2. The dielectric layer 920 of the intermediate structure 1700 of FIGS. 17A and 17B may be removed using a wet etch. Thus, for memory devices (such as the memory device 200 of FIGS. 2A and 2B) the dipole layer 224 and the dielectric layer 204 sidewalls are exposed, and for logic devices (such as the logic device 300 of FIGS. 3A and 3B) the cap layer 206 is exposed.

The oxygen scavenging layer 230 of the intermediate structure 1600 of FIGS. 16A and 16B, and the oxygen scavenging layer 230 of the intermediate structure 1700 of FIGS. 17A and 17B, may be removed by etching the oxygen scavenging layer 230 over the entire die 100 of FIG. 1. Thus, the oxygen scavenging layer 230 of the intermediate structure 1600 of FIGS. 16A and 16B (e.g., the oxygen scavenging layer 230 of an intermediate structure of the memory device 200 of FIGS. 2A and 2B) may be removed during the fabrication step or steps used to remove the oxygen scavenging layer 230 of the intermediate structure 1700 of FIGS. 17A and 17B (e.g., the oxygen scavenging layer of an intermediate structure of the logic device 300 of FIGS. 3A and 3B).

Subsequently, the barrier layer 208, the work function metal layer 210, the second barrier layer 212, and the fill metal layer 216 may be formed (e.g., deposited) for memory devices and logic devices at the same time to form the structures illustrated in FIGS. 2A, 2B, 3A, and 3B. For example, the barrier layer 208, the work function metal layer 210, and the second barrier layer 212 may deposited in the gate region 290 of the memory device 200 and in the gate region 390 of the logic device 300 using one or more ALD processes. The barrier layer 208, the work function metal layer 210, the second barrier layer 212, and the metal fill layer 216 of the memory device 200 may be deposited over the entire die 100 of FIG. 1. Thus, with reference to FIGS. 2A and 2B, the barrier layer 208, the work function metal layer 210, the second barrier layer 212, and the metal fill layer 216 of the memory device 200 may be deposited during the fabrication step or steps used to form the barrier layer 208, the work function metal layer 210, the second barrier layer 212, and the metal fill layer 216 of the logic device 300 of FIGS. 3A and 3B. Portions of layers deposited proximate to (e.g., on, above, or over) the ILD 222 and/or proximate to (e.g., on, above, or over) an end of the spacers 202 of the memory device 200 and the logic device 300 may be removed (e.g., by a CMP process) before applying the barrier layer 208, between one or more deposition steps of the eighth stage, and/or after deposition of the fill metal layer 216. For example, with reference to FIGS. 2A and 2B, CMP may be performed to remove portions of the dielectric layer 204, the barrier layer 208, the work function metal layer 210, the second barrier layer 212, and/or the fill metal layer 216, formed proximate to (e.g., on, above, or over) the ILD 222 of the memory device 200 and/or beyond (e.g., on, above, or over) the spacers 202 of the memory device 200. Additionally or alternatively, with reference to FIGS. 3A and 3B, CMP may be performed to remove portions of the dielectric layer 204, the cap layer 206, the barrier layer 208, the work function metal layer 210, the second barrier layer 212, and/or the fill metal layer 216, formed proximate to (e.g., on, above, or over) the ILD 222 of the logic device 300 and/or proximate to (e.g., on, above, or over) and end of the spacers 202 of the logic device 300.

Figure 20:
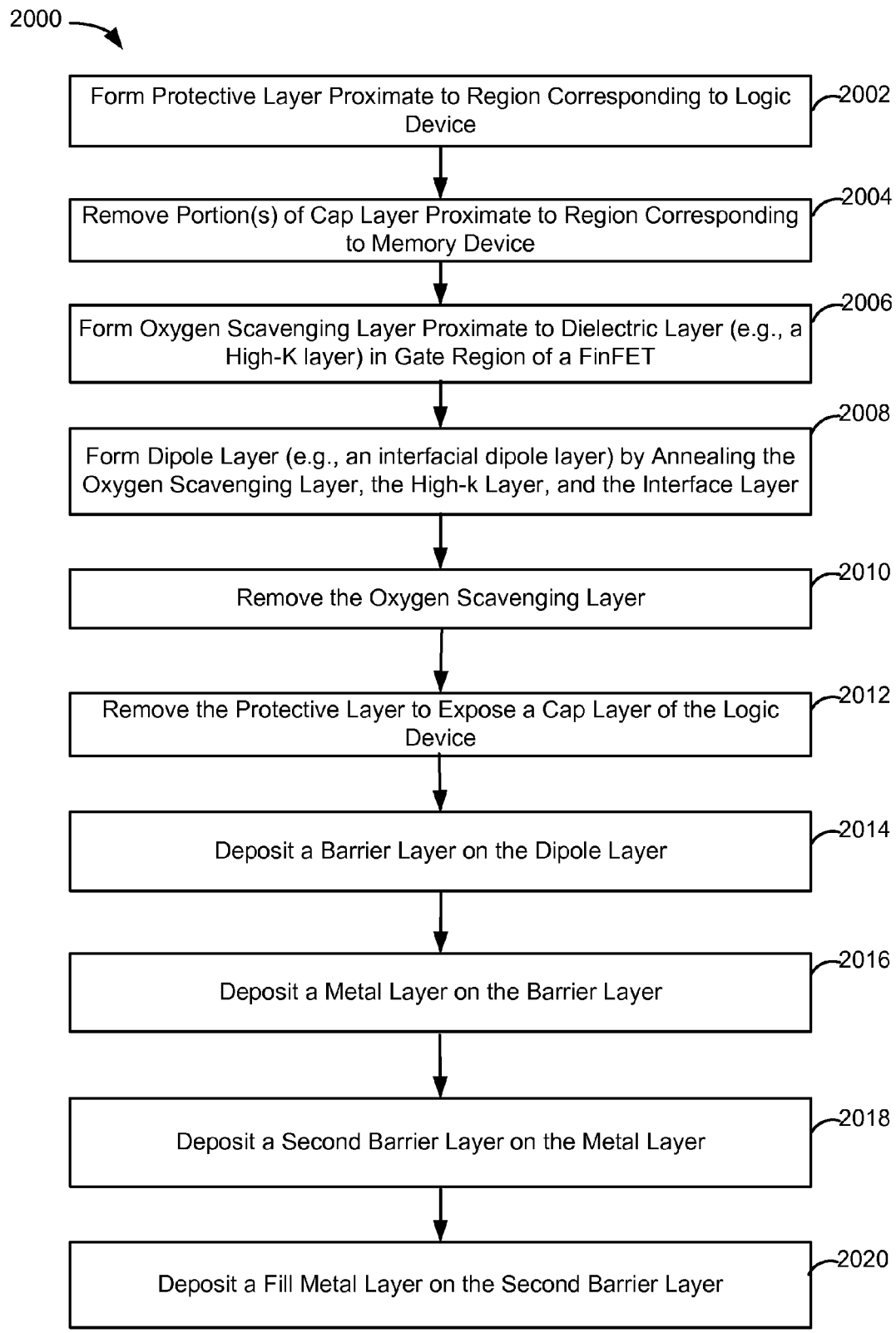
FIG. 20 is a flow chart of a illustrative embodiment of a method of an electronic device that includes the memory device of FIGS. 2A and 2B and the logic device of FIGS. 3A and 3B.

Referring to FIG. 20, a flow chart of an illustrative embodiment of a method 2000 of fabricating an electronic device is depicted. The electronic device may include the memory device 200 of FIGS. 2A and 2B and the logic device 300 of FIGS. 3A and 3B. The method may include the fifth through eighth stages described with reference to FIGS. 12A, 12B, 13A, 13B, 14A, 14B, 15A, 15B, 16A, and 16B.

For example, the method 2000 may include, at 2002, forming a protective layer over a region of a die corresponding to a logic device. The protective layer may correspond to the dielectric layer 920 of FIGS. 13A and 13B. For example, the protective layer may be formed in the logic region 110 of FIG. 1 using one or more deposition processes (e.g., a spin-coating process) and/or one or more removal processes (e.g., an etch process) as described above with reference to the fifth stage of FIGS. 12A, 12B, 13A and 13B. The protective layer (e.g., the dielectric layer 920 of FIGS. 13A and 13B) may initially be formed in at least a portion of the logic region 110 of FIG. 1 and at least a portion of the memory region 105 of FIG. 1. A portion of the protective layer (e.g., the dielectric layer 920 of FIGS. 13A and 13B) formed in the memory region 105 of FIG. 1 (e.g., on the intermediate structure 1000 of FIGS. 10A and 10B) may be removed to expose the cap layer 206 of the intermediate structure 1000 of FIGS. 10A and 10B.

The method 2000 may include removing, at 2004, one or more portions of the cap layer 206 of the intermediate structure 1000 of FIGS. 10A and 10B. For example, one or more portions of the cap layer 206 of FIGS. 10A and 10B in the gate region 290 may be removed using an etch process as described above with reference to the fifth stage of FIGS. 12A and 12B. Removing a portion of the cap layer 206 applied to the memory region 105 of FIG. 1 during formation of the memory device 200 of FIGS. 2A and 2B may expose a dielectric layer 204 of FIGS. 12A and 12B formed in the memory region 105 of FIG. 1 during formation of the memory device 200 of FIGS. 2A and 2B.

The method 2000 may include forming, at 2006, an oxygen scavenging layer proximate to a dielectric layer in a gate region 290 of the memory device 200 of FIGS. 2A and 2B. The dielectric layer may correspond to the dielectric layer 204 of the intermediate structure 1400 of FIGS. 14A and 14B, and the dielectric layer 204 may be formed as explained above with reference to the fourth stage of forming the gate stack of the memory device 200 of FIGS. 2A and 2B. The oxygen scavenging layer may correspond to the oxygen scavenging layer 230 of FIGS. 14A and 14B, and may be formed as explained above with reference to the sixth stage of forming a gate stack of the memory device 200 of FIGS. 2A and 2B. In some examples, the oxygen scavenging layer 230 of FIGS. 14A and 14B may be formed proximate to the gate region of a FinFET. For example, the oxygen scavenging layer 230 may be formed above, over, or on a fin 220 of the memory device 200 of FIGS. 2A and 2B (e.g., a FinFET). An interface layer may be between the dielectric layer and a fin of the FinFET. For example, the interface layer 214 of FIGS. 14A and 14B may be formed between the oxygen scavenging layer 230 and the fin 220 of the FinFET.

The method 2000 may include, at 2008, forming a dipole layer by annealing the oxygen scavenging layer 230 of FIGS. 14A and 14B, the dielectric layer 204 of FIGS. 14A and 14B, and the interface layer 214 of FIGS. 14A and 14B as described above with reference to the seventh stage of forming the gate stack of the memory device 200 of FIGS. 2A and 2B. For example, a low-temperature (e.g., less than 400 deg. C.) anneal process may be performed. The low-temperature anneal process may cause the oxygen scavenging layer 230 of FIGS. 14A and 14B to strip oxygen from the dielectric layer 204 of an intermediate structure of the memory device 200 of FIGS. 2A and 2B (e.g., the intermediate structure 1400 of FIGS. 14A and 14B).

Accordingly, in areas where the oxygen scavenging layer 230 and the dielectric layer 204 are in direct contact, such as in the intermediate structure 1400 of FIGS. 14A and 14B, the titanium of the oxygen scavenging layer 230 may strip oxygen from the dielectric layer 204. In areas where the dielectric layer 204 is in contact with the oxygen scavenging layer 230 and the interface layer 214, such as in the intermediate structure 1400 of FIGS. 14A and 14B, the oxygen scavenging may lead to formation of the dipole layer 224 of FIGS. 2A, 2B, 16A, and 16B. For example, the titanium of the oxygen scavenging layer 230 of FIGS. 14A and 14B may have a stronger affinity for oxygen than does the hafnium of the dielectric layer 204. Accordingly, the titanium of the oxygen scavenging layer 230 may strip oxygen from the dielectric layer 204. The hafnium of the dielectric layer 204 (after having oxygen stripped away) may have a stronger affinity for oxygen than the silicon of the interface layer 214. Accordingly, the hafnium of the dielectric layer 204 may interact with the silicon dioxide of the interface layer 214 to form HfSiO4 of the dipole layer 224 of FIGS. 2A, 2B, 16A, and 16B.

In contrast, as the dielectric layer 204 of the intermediate structure 1700 (of FIGS. 17A and 17B) of the logic device 300 (of FIGS. 3A and 3B) is not in contact with the oxygen scavenging layer 230 of FIGS. 17A and 17B, the dielectric layer 204 of the intermediate structure 1700 may not interact with the interface layer 214 of the intermediate structure 1700 to form a dipole layer in response to the annealing process. Thus, a dipole layer may not be formed in the logic device 300 of FIGS. 3A and 3B.

The method 2000 may include removing, at 2010, the oxygen scavenging layer 230 from the memory region 105 of FIG. 1 and the logic region 110 of FIG. 1. For example, the oxygen scavenging layer 230 of the intermediate structures 1600 and 1700 of FIGS. 16A, 16B, 17A, and 17B may be removed as described above with reference to the eighth stage of forming the gate stacks of the memory device 200 (of FIGS. 2A and 2B) and of the logic device 300 (of FIGS. 3A and 3B). As an example, the oxygen scavenging layer 230 may be removed using SC-1 or SC-2.

The method 2000 may include removing, at 2012, the protective layer of the intermediate structure 1700 (of FIGS. 17A and 17B) of the logic device 300 (of FIGS. 3A and 3B). For example, the dielectric layer 920 of FIGS. 17A and 17B may be removed as described above with reference to the eighth stage of forming the gate stack of the logic device 300 of FIGS. 3A and 3B. The dielectric layer 920 of the intermediate structure 1700 of FIGS. 17A and 17B may be removed using a wet etch. Thus, for memory devices (such as the memory device 200 of FIGS. 2A and 2B) the dipole layer 224 and the dielectric layer 204 sidewalls are exposed, and for logic devices (such as the logic device 300 of FIGS. 3A and 3B), the cap layer 206 is exposed.

The method 2000 may include depositing, at 2014, a barrier layer. For example, the barrier layer 208 may be deposited on the dipole layer 224 of the intermediate structure 1800 of FIG. 18B as described with reference to the eighth stage of forming the gate stack of the memory device

200 of FIGS. 2A and 2B. In some examples, the barrier layer 208 may be deposited proximate to the cap layer 206 of the intermediate structure 1900 (of FIGS. 19A and 19B) of the logic device 300 (of FIGS. 3A and 3B) and additionally (e.g., concurrently) deposited proximate to the dipole layer 224 of the intermediate structure 1800 (of FIG. 18B) of the memory device 200 (of FIGS. 2A and 2B). The barrier layer 208 of FIGS. 2A, 2B, 3A, and 3B may be deposited over the entire die 100 of FIG. 1, including over the memory region 105 and the logic region 110. Thus, the barrier layer 208 of the memory device 200 of FIGS. 2A and 2B may be deposited during the fabrication step or steps used to form the barrier layer 208 of the logic device 300 of FIGS. 3A and 3B.

The method 2000 may include depositing, at 2016, a metal layer proximate to the barrier layer 208. The work function metal layer 210 may be deposited on the barrier layer 208 of FIGS. 2A and 2B as described with reference to the eighth stage of forming the gate stack of the memory device 200. In some examples, the work function metal layer 210 may be deposited proximate to the barrier layer 208 of the logic device 300 of FIGS. 3A and 3B and proximate to the barrier layer 208 of the memory device 200 of FIGS. 2A and 2B. The work function metal layer 210 of FIGS. 2A, 2B, 3A, and 3B may be deposited over the entire die 100 of FIG. 1, including over the memory region 105 and the logic region 110. Thus, the work function metal layer 210 of the memory device 200 of FIGS. 2A and 2B may be deposited during the fabrication step or steps used to form the work function metal layer 210 of the logic device 300 of FIGS. 3A and 3B.

The method 2000 may include depositing, at 2018, a second barrier layer proximate to the work function metal layer 210. For example, the second barrier layer 212 may be deposited on the work function metal layer 210 of the memory device 200 of FIGS. 2A and 2B. The second barrier layer 212 may be deposited on the barrier layer 208 of FIGS. 2A and 2B as described with reference to the eighth stage of forming the gate stack of the memory device 200. In some examples, the second barrier layer 212 may be deposited proximate to the work function metal layer 210 of the logic device 300 of FIGS. 3A and 3B and proximate to the work function metal layer 210 of the memory device 200. The second barrier layer 212 of FIGS. 2A, 2B, 3A, and 3B may be deposited over the entire die 100 of FIG. 1, including over the memory region 105 and the logic region 110. Thus, the second barrier layer 212 of the memory device 200 of FIGS. 2A and 2B may be deposited during the fabrication step or steps used to form the second barrier layer 212 of the logic device 300 of FIGS. 3A and 3B.

The method 2000 may include depositing, at 2020, a fill metal layer proximate to the second barrier layer 212. For example, the fill metal layer 216 may be deposited on the second barrier layer 212 of at least a portion of the memory device 200 of FIGS. 2A and 2B. The fill metal layer 216 may be deposited on the second barrier layer 212 as described with reference to the eighth stage of forming the gate stack of the memory device 200. In some examples, the fill metal layer 216 may be deposited proximate to the second barrier layer 212 of the logic device 300 of FIGS. 3A and 3B and proximate to the second barrier layer 212 of the memory device 200 of FIGS. 2A and 2B. The fill metal layer 216 of FIGS. 2A, 2B, 3A, and 3B may be deposited over the entire die 100 of FIG. 1, including over the memory region 105 and the logic region 110. Thus, the fill metal layer 216 of the memory device 200 of FIGS. 2A and 2B may be deposited during the fabrication step or steps used to form the fill metal layer 216 of the logic device 300 of FIGS. 3A and 3B.

Thus, the method 2000 may be used to form the memory device 200 including the dipole layer 224 in a manner that is compatible with high-k metal-gate processes. By forming the dipole layer 224 in this manner, a single process flow can be used to form the memory device 200 (including the dipole layer 224) and the logic device 300. Using a single process flow may reduce manufacturing costs relative to costs associated with multi-flow processes.

Figure 21:
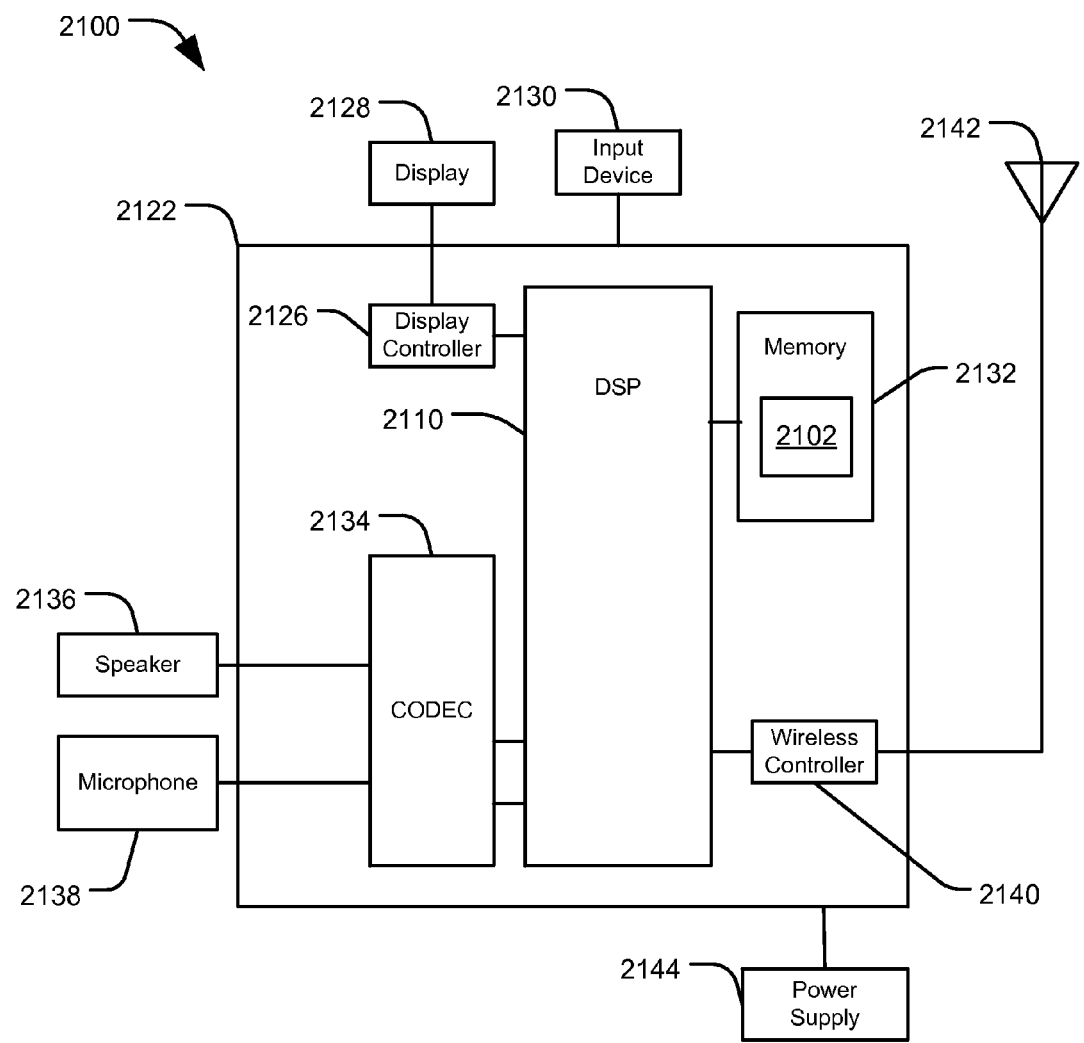
FIG. 21 is a block diagram of a wireless device including the memory device of FIGS. 2A and 2B, the logic device of FIGS. 3A and 3B, or both.

Referring to FIG. 21, a block diagram of a particular illustrative embodiment of a wireless communication device is depicted and generally designated 2100. The device 2100 includes a processor, such as a digital signal processor (DSP) 2110, coupled to a memory 2132. The memory 2132 may include one or more electronic devices 2102 (e.g., an integrated circuit). In an illustrative embodiment, the one or more electronic devices 2102 may correspond to or include the memory device 200 of FIGS. 2A and 2B and/or the logic device 300 of FIGS. 3A and 3B. In some examples, the memory device 200 of FIGS. 2A and 2B and the logic device 300 of FIGS. 3A and 3B may be formed on a single die (e.g., of the integrated circuit). In some examples, the memory device 200 of FIGS. 2A and 2B and the logic device 300 of FIGS. 3A and 3B may each include or form a FinFET (e.g., a FE FinFET). In some examples, the memory device 200 of FIGS. 2A and 2B may be used as a transistor in a memory cell. For example, the memory device 200 may operate as a pass transistor in the memory cell.

FIG. 21 also shows a display controller 2126 that is coupled to the digital signal processor 2110 and to a display 2128. A coder/decoder (CODEC) 2134 can also be coupled to the digital signal processor 2110. A speaker 2136 and a microphone 2138 can be coupled to the CODEC 2134.

FIG. 21 also indicates that a wireless controller 2140 can be coupled to the digital signal processor 2110 and to a wireless antenna 2142. In a particular embodiment, the DSP 2110, the display controller 2126, the memory 2132, the CODEC 2134, and the wireless controller 2140 are included in a system-in-package or system-on-chip device 2122. In a particular embodiment, an input device 2130 and a power supply 2144 are coupled to the system-on-chip device 2122. Moreover, in a particular embodiment, as illustrated in FIG. 21, the display 2128, the input device 2130, the speaker 2136, the microphone 2138, the wireless antenna 2142, and the power supply 2144 are external to the system-on-chip device 2122. However, each of the display 2128, the input device 2130, the speaker 2136, the microphone 2138, the wireless antenna 2142, and the power supply 2144 can be coupled to a component of the system-on-chip device 2122, such as an interface or a controller.

In conjunction with the described embodiments, a system is disclosed that may include means for storing (one or more bits) formed in a memory region (e.g., an embedded memory region) of a die. For example, the means for storing formed in a memory region may correspond to the memory device 200 of FIGS. 2A and 2B, one or more other devices or circuits configured to store one or more bits, or any combination thereof. The means for storing may include a first gate that includes a dipole layer. For example, the means for storing may include the dipole layer 224 of FIGS. 2A and 2B.

The system may also include means for performing a logical function formed in a logic device region of the die, such as the logic device 300 of FIGS. 3A and 3B. The means for performing may include a second gate. The second gate may include an interface layer, such as the interface layer 214 of the logic device 300. The second gate may include a dielectric layer, such as the dielectric layer 204 of the logic device 300. The second gate may include and a cap layer, such as the cap layer 206 of the logic device. The dielectric layer 204 may be formed proximate to the interface layer 214 and between the cap layer 206 and the interface layer 214 of the logic device 300.

Figure 22:
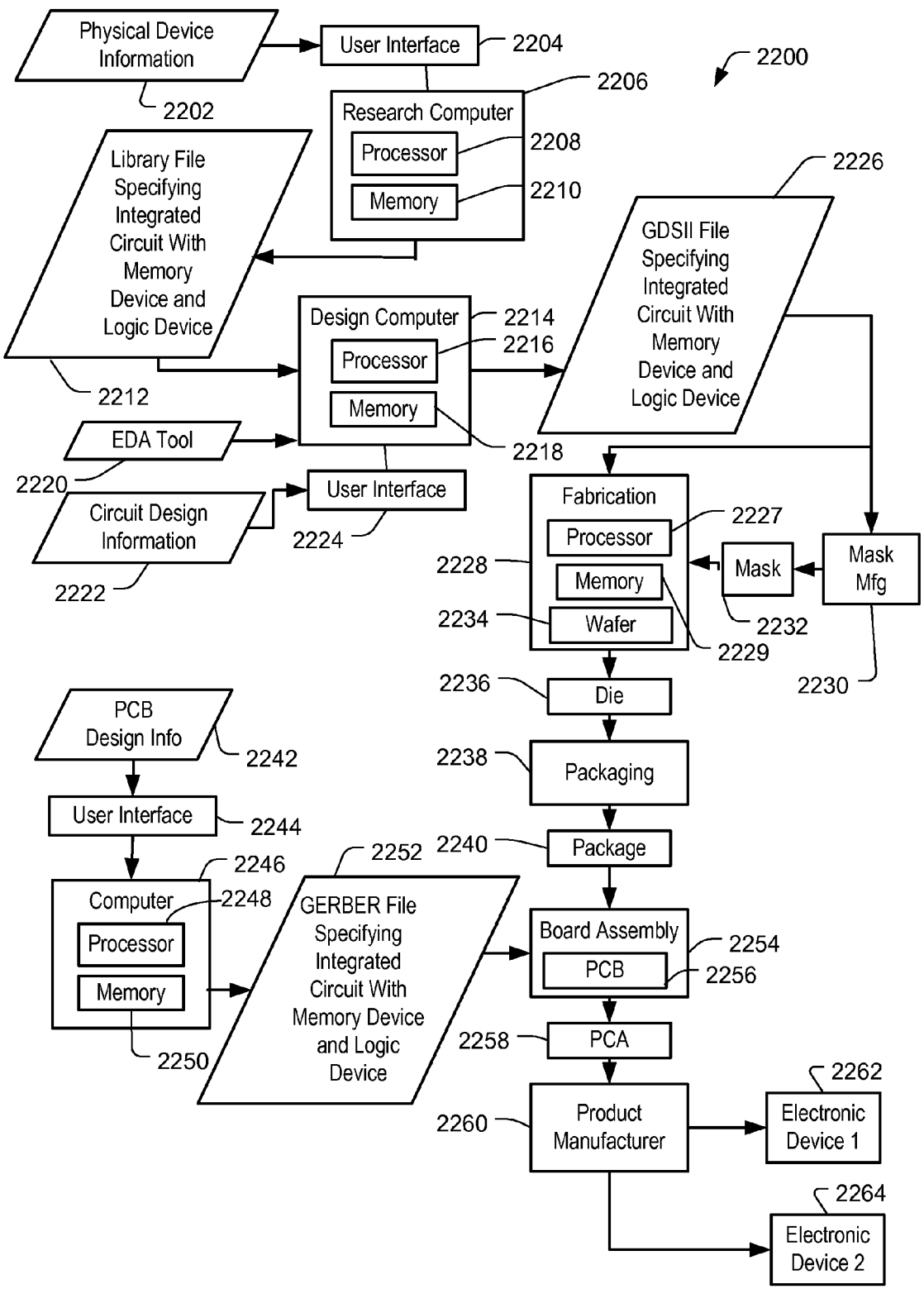
FIG. 22 is a data flow diagram of a particular illustrative embodiment of a manufacturing process to manufacture electronic devices that include the memory device of FIGS. 2A and 2B, the logic device of FIGS. 3A and 3B, or both.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 22 depicts a particular illustrative embodiment of an electronic device manufacturing process 2200.

Physical device information 2202 is received at the manufacturing process 2200, such as at a research computer 2206. The physical device information 2202 may include design information representing at least one physical property of a semiconductor device, such as the die 100 of FIG. 1, the memory device 200 of FIGS. 2A and 2B, or the logic device 300 of FIGS. 3A and 3B. For example, the physical device information 2202 may include physical parameters, material characteristics, and structure information that is entered via a user interface 2204 coupled to the research computer 2206. The research computer 2206 includes a processor 2208, such as one or more processing cores, coupled to a computer readable medium such as a memory 2210. The memory 2210 may store computer readable instructions that are executable to cause the processor 2208 to transform the physical device information 2202 to comply with a file format and to generate a library file 2212.

In a particular embodiment, the library file 2212 includes at least one data file including the transformed design information. For example, the library file 2212 may include a library of semiconductor devices including a device that includes the memory device 200 of FIGS. 2A and 2B, the logic device 300 of FIGS. 3A and 3B, or a combination thereof, such as the die 100 of FIG. 1, that is provided for use with an electronic design automation (EDA) tool 2220.

The library file 2212 may be used in conjunction with the EDA tool 2220 at a design computer 2214 including a processor 2216, such as one or more processing cores, coupled to a memory 2218. The EDA tool 2220 may be stored as processor executable instructions at the memory 2218 to enable a user of the design computer 2214 to design a circuit including the memory device 200 of FIGS. 2A and 2B, the logic device 300 of FIGS. 3A and 3B, or a combination thereof, such as the die 100 of FIG. 1, of the library file 2212. For example, a user of the design computer 2214 may enter circuit design information 2222 via a user interface 2224 coupled to the design computer 2214. The circuit design information 2222 may include design information representing at least one physical property of a semiconductor device, such as the die 100 of FIG. 1, the memory device 200 of FIGS. 2A and 2B, and/or the logic device 300 of FIGS. 3A and 3B. To illustrate, the circuit design property may include identification of particular circuits and relationships to other elements in a circuit design, positioning information, feature size information, interconnection information, or other information representing a physical property of a semiconductor device.

The design computer 2214 may be configured to transform the design information, including the circuit design information 2222, to comply with a file format. To illustrate, the file formation may include a database binary file format representing planar geometric shapes, text labels, and other information about a circuit layout in a hierarchical format, such as a Graphic Data System (GDSII) file format. The design computer 2214 may be configured to generate a data file including the transformed design information, such as a GDSII file 2226 that includes information describing the die 100 of FIG. 1, the memory device 200 of FIGS. 2A and 2B, and/or the logic device 300 of FIGS. 3A and 3B, in addition to other circuits or information. To illustrate, the data file may include information corresponding to a system-on-chip (SOC) that includes the die 100 of FIG. 1, the memory device 200 of FIGS. 2A and 2B, and/or the logic device 300 of FIGS. 3A and 3B, and that also includes additional electronic circuits and components within the SOC.

The GDSII file 2226 may be received at a fabrication process 2228 to manufacture the die 100 of FIG. 1, the memory device 200 of FIGS. 2A and 2B, and/or the logic device 300 of FIGS. 3A and 3B, according to transformed information in the GDSII file 2226. For example, a device manufacture process may include providing the GDSII file 2226 to a mask manufacturer 2230 to create one or more masks, such as masks to be used with photolithography processing, illustrated as a representative mask 2232. The mask 2232 may be used during the fabrication process to generate one or more wafers 2234, which may be tested and separated into dies, such as a representative die 2236. The die 2236 includes a circuit including the die 100 of FIG. 1, the memory device 200 of FIGS. 2A and 2B, and/or the logic device 300 of FIGS. 3A and 3B.

For example, the fabrication process 2228 may include a processor 2227 and a memory 2229 to initiate and/or control the fabrication process 2228. The memory 2229 may include executable instructions such as computer-readable instructions or processor-readable instructions. The executable instructions may include one or more instructions that are executable by a computer such as the processor 2227. In a particular embodiment, the executable instructions may cause a computer to perform the process 2200 of FIG. 22 or at least a portion thereof.

The fabrication process 2228 may be implemented by a fabrication system that is fully automated or partially automated. For example, the fabrication process 2228 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD), physical vapor deposition (PVD), or ALD. As a further example, the fabrication equipment may, additionally or alternatively, be configured to apply a hardmask, to apply an etching mask, to perform etching, to perform planarization, to form a gate stack, and/or to perform a standard clean 1 type or a standard clean 2 type. In a particular embodiment, the fabrication process 2228 corresponds to a semiconductor manufacturing process associated with a technology node smaller than 14 nm (e.g., 10 nm, 7 nm, etc.). The specific process or combination of processes used to manufacture a device, such as the die 100 of FIG. 1, that includes the memory device 200 of FIGS. 2A and 2B and/or the logic device 300 of FIGS. 3A and 3B may be based on design constraints and available materials/equipment. Thus, in particular embodiments, different processes may be used than those described with reference to FIG. 1, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B or 20-21 to manufacture the device.

The fabrication system (e.g., an automated system that performs the fabrication process 2228) may have a distributed architecture (e.g., a hierarchy). For example, the fabrication system may include one or more processors, such as the processor 2227, one or more memories, such as the memory 2229, and/or controllers that are distributed according to the distributed architecture. The distributed architecture may include a high-level processor that controls or initiates operations of one or more low-level systems. For example, a high-level portion of the fabrication process 2228 may include one or more processors, such as the processor 2227, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 2227.

Alternatively, the processor 2227 may be a part of a high-level system, subsystem, or component of the fabrication system. In another embodiment, the processor 2227 includes distributed processing at various levels and components of a fabrication system.

The executable instructions included in the memory 2229 may enable the processor 2227 to form (or to initiate formation of) the die 100 of FIG. 1, the memory device 200 of FIGS. 2A and 2B, and/or the logic device 300 of FIGS. 3A and 3B. In a particular embodiment, the memory 2229 is a non-transitory computer-readable medium storing computer-executable instructions that are executable by the processor 2227 to cause the processor 2227 to initiate formation of a device in accordance with at least a portion of the method 2000 of FIG. 20. For example, the computer executable instructions may be executable to cause the processor 2227 to initiate formation of the dipole layer 224 of FIGS. 2A and 2B or another layer or component of the memory device 200 of FIGS. 2A and 2B, the logic device 300 of FIGS. 3A and 3B, or a combination thereof. As an illustrative example, the processor 2227 may initiate or control one or more steps of the method 2000 of FIG. 20.

The die 2236 may be provided to a packaging process 2238 where the die 2236 is incorporated into a representative package 2240. For example, the package 2240 may include the single die 2236 or multiple dies, such as a system-in-package (SiP) arrangement. The package 2240 may be configured to conform to one or more standards or specifications, such as Joint Electron Device Engineering Council (JEDEC) standards.

Information regarding the package 2240 may be distributed to various product designers, such as via a component library stored at a computer 2246. The computer 2246 may include a processor 2248, such as one or more processing cores, coupled to a memory 2250. A printed circuit board (PCB) tool may be stored as processor executable instructions at the memory 2250 to process PCB design information 2242 received from a user of the computer 2246 via a user interface 2244. The PCB design information 2242 may include physical positioning information of a packaged semiconductor device on a circuit board, the packaged semiconductor device corresponding to the package 2240 including the die 100 of FIG. 1, the memory device 200 of FIGS. 2A and 2B, and/or the logic device 300 of FIGS. 3A and 3B.

The computer 2246 may be configured to transform the PCB design information 2242 to generate a data file, such as a GERBER file 2252 with data that includes physical positioning information of a packaged semiconductor device on a circuit board, as well as layout of electrical connections such as traces and vias, where the packaged semiconductor device corresponds to the package 2240 including the die 100 of FIG. 1, the memory device 200 of FIGS. 2A and 2B, and/or the logic device 300 of FIGS. 3A and 3B. In other embodiments, the data file generated by the transformed PCB design information may have a format other than a GERBER format.

The GERBER file 2252 may be received at a board assembly process 2254 and used to create PCBs, such as a representative PCB 2256, manufactured in accordance with the design information stored within the GERBER file 2252. For example, the GERBER file 2252 may be uploaded to one or more machines to perform various steps of a PCB production process. The PCB 2256 may be populated with electronic components including the package 2240 to form a representative printed circuit assembly (PCA) 2258.

The PCA 2258 may be received at a product manufacture process 2260 and integrated into one or more electronic devices, such as a first representative electronic device 2262 and a second representative electronic device 2264. As an illustrative, non-limiting example, the first representative electronic device 2262, the second representative electronic device 2264, or both, may be selected from the group of a set top box, a music player, a video player, an entertainment unit, a navigation device, a communications device, a personal digital assistant (PDA), a fixed location data unit, and a computer, into which the die 100 of FIG. 1, the memory device 200 of FIGS. 2A and 2B, and/or the logic device 300 of FIGS. 3A and 3B is integrated. As another illustrative, non-limiting example, one or more of the electronic devices 2262 and 2264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 22 illustrates remote units according to teachings of the disclosure, the disclosure is not limited to these illustrated units. Embodiments of the disclosure may be suitably employed in any device which includes active integrated circuitry including memory and on-chip circuitry.

As another illustrative, non-limiting example, one or more of the electronic devices 2262 and 2264 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 22 illustrates remote units according to teachings of the disclosure, the disclosure is not limited to these illustrated units. Embodiments of the disclosure may be suitably employed in any device which includes active integrated circuitry including memory and on-chip circuitry. For example, one or more of the electronic devices 2262 and 2264 may include cars, trucks, airplanes, boats, other vehicles, or appliances, such as refrigerators, microwaves, washing machines, security systems, or a combination thereof. In a particular embodiment, one or more of the electronic devices 2262 and 2264 may utilize memory and/or wireless communication.

A device, such as the die 100 of FIG. 1, that includes the memory device 200 of FIGS. 2A and 2B, the logic device 300 of FIGS. 3A and 3B, or any combination thereof, may be fabricated, processed, and incorporated into an electronic device, as described in the illustrative process 2200 of FIG. 22. One or more aspects of the embodiments disclosed with respect to FIG. 1, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B or 20-21 may be included at various processing stages, such as within the library file 2212, the GDSII file 2226, and the GERBER file 2252, as well as stored at the memory 2210 of the research computer 2206, the memory 2218 of the design computer 2214, the memory 2250 of the computer 2246, the memory of one or more other computers or processors (not shown) used at the various stages, such as at the board assembly process 2254, and also incorporated into one or more other physical embodiments such as the mask 2232, the die 2236, the package 2240, the PCA 2258, other products such as prototype circuits or devices (not shown), or any combination thereof. Although various representative stages of production from a physical device design to a final product are depicted, in other embodiments fewer stages may be used or additional stages may be included. Similarly, the process 2200 may be performed by a single entity or by one or more entities performing various stages of the process 2200.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An integrated circuit device, comprising:
a first transistor structure in a memory region of a die, the first transistor structure having a substrate and a first gate, the first gate including a dipole layer proximate to the substrate and a barrier layer proximate to the dipole layer; and
a second transistor structure in a logic device region of the die, the second transistor structure having a second gate, the second gate including an interface layer, a dielectric layer, and a cap layer, the dielectric layer between the cap layer and the interface layer.

2. The integrated circuit device of claim 1, wherein the barrier layer is on the dipole layer and on the cap layer.

3. The integrated circuit device of claim 1, wherein the dielectric layer includes hafnium oxide ($HfO_2$), the dipole layer includes hafnium silicon oxide ($HfSiO_4$), or both.

4. The integrated circuit device of claim 1, wherein the first transistor structure comprises a first field effect transistor (FET), the substrate includes a substrate of the first FET, and the second transistor structure comprises a second FET.

5. The integrated circuit device of claim 4, wherein the interface layer is proximate to a second substrate of the second FET.

6. The integrated circuit device of claim 1, wherein a gate stack of the first gate includes:
a metal layer proximate to the barrier layer;
a second barrier layer proximate to the metal layer; and
a fill metal layer proximate to the second barrier layer.

7. The integrated circuit device of claim 6, wherein a gate stack of the second gate includes:
the interface layer proximate to a second substrate;
the dielectric layer proximate to the interface layer;
the cap layer proximate to the dielectric layer;
the barrier layer proximate to the cap layer;
the metal layer proximate to the barrier layer;
the second barrier layer proximate to the metal layer; and
the fill metal layer proximate to the second barrier layer.

8. An integrated circuit device comprising:
means for storing one or more bits formed in a memory region of a die, the means for storing including a first gate that includes a dipole layer; and
means for performing a logical function formed in a logic device region of the die, the means for performing including a second gate, the second gate including an interface layer, a dielectric layer, and a cap layer, the dielectric layer proximate to the interface layer and between the cap layer and the interface layer.

9. The integrated circuit device of claim 8, wherein a barrier layer is on the dipole layer and on the cap layer.

10. The integrated circuit device of claim 8, wherein the dielectric layer includes hafnium oxide ($HfO_2$), the dipole layer includes hafnium silicon oxide ($HfSiO_4$), or both.

11. The integrated circuit device of claim 8, wherein a gate stack of the first gate includes:
a metal layer proximate to a barrier layer;
a second barrier layer proximate to the metal layer; and
a fill metal layer proximate to the second barrier layer.

12. The integrated circuit device of claim 11, wherein a gate stack of the second gate includes:
the interface layer proximate to a second substrate;
the dielectric layer proximate to the interface layer;
the cap layer proximate to the dielectric layer;
the barrier layer proximate to the cap layer;
the metal layer proximate to the barrier layer;
the second barrier layer proximate to the metal layer; and
the fill metal layer proximate to the second barrier layer.

* * * * *